(12) United States Patent
Maraaba et al.

(10) Patent No.: US 11,506,717 B1
(45) Date of Patent: Nov. 22, 2022

(54) SYSTEM AND METHOD FOR DIAGNOSING STATOR INTER-TURN FAULTS IN SYNCHRONOUS MOTORS

(71) Applicant: KING FAHD UNIVERSITY OF PETROLEUM AND MINERALS, Dhahran (SA)

(72) Inventors: Luqman Sulyman Faez Sulyman Maraaba, Dhahran (SA); Azhar Mehmood Mehmood Memon, Dhahran (SA); Mohamed Ali Yousif Ali Abido, Dhahran (SA); Luai Muhammad Muhammad Alhems, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 0 days.

(21) Appl. No.: 17/713,742

(22) Filed: Apr. 5, 2022

Related U.S. Application Data

(60) Provisional application No. 63/254,310, filed on Oct. 11, 2021.

(51) Int. Cl.
*G01R 31/00* (2006.01)
*G01R 31/34* (2020.01)
*G01H 1/00* (2006.01)

(52) U.S. Cl.
CPC ........... *G01R 31/343* (2013.01); *G01H 1/003* (2013.01)

(58) Field of Classification Search
CPC .............................. G01H 1/003; G01R 31/343
See application file for complete search history.

(56) References Cited

U.S. PATENT DOCUMENTS

2021/0311122 A1* 10/2021 Zhang .................... G01H 13/00

FOREIGN PATENT DOCUMENTS

CN 112052796 A 12/2020

OTHER PUBLICATIONS

Maraaba et al. Recognition of Stator Winding Inter-Turn Fault in Interior-Mount LSPMSM Using Acoustic Signals; Symmetry Aug. 2020 (Year: 2020).*
Maraaba, et al. ; Recognition of Stator Winding Inter-Turn Fault in Interior-Mount LSPMSM Using Acoustic Signals ; Symmetry 12 ; 2020.
Nakamura, et al. ; A Diagnosis Method of Bearing and Stator Fault in Motor Using Rotating Sound Based on Deep Learning ; Energies 14 ; Mar. 1, 2021.

(Continued)

*Primary Examiner* — Alesa Allgood
(74) *Attorney, Agent, or Firm* — Oblon, McClelland, Maier & Neustadt, L.L.P.

(57) ABSTRACT

A system, method, and non-transitory computer readable medium for diagnosing stator inter-turn faults in a Line Start Permanent Magnet Synchronous Motor (LSPMSM) are described. The method of diagnosing stator inter-turn faults in the LSPMSM includes collecting acoustic signals that are generated from a LSPMSM by a communication device, analyzing via singular spectrum analysis (SSA) the collected acoustic signals for fault detection of the stator inter-turn faults, and determining a fault diagnosis for the fault detection by executing a Fast Fourier Transform (FFT).

20 Claims, 22 Drawing Sheets

(56) References Cited

OTHER PUBLICATIONS

Glowacz ; Diagnostics of DC and Induction Motors Based on the Analysis of Acoustic Signals ; Measurement Science Review vol. 14, No. 5 ; Oct. 2014.
Maraaba, et al. ; An efficient acoustic-based diagnosis of inter-turn fault in interior mount LSPMSM ; Applied Acoustics 173 ; Oct. 10, 2020.

* cited by examiner

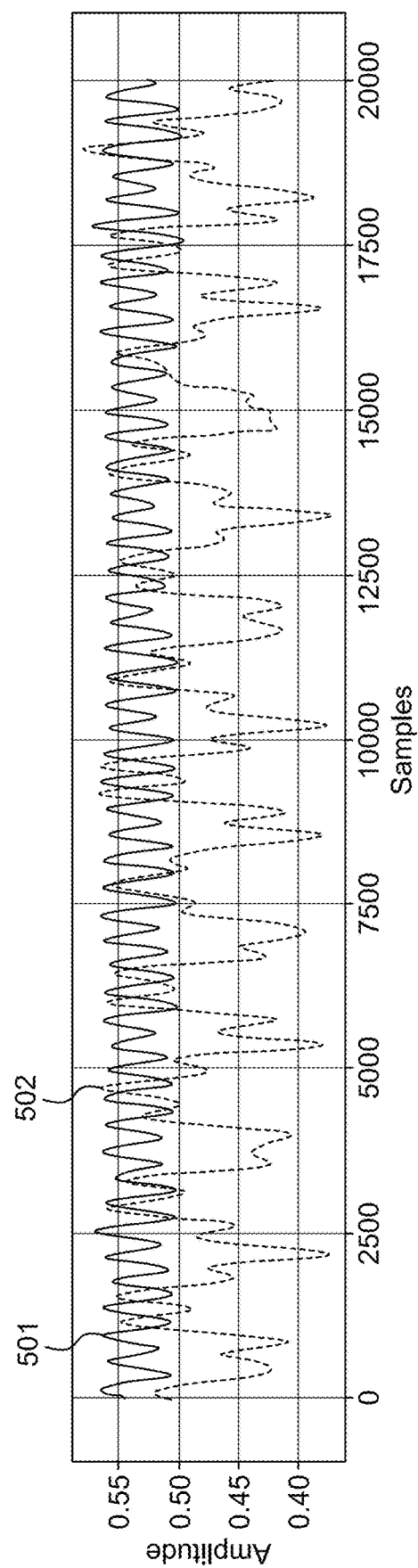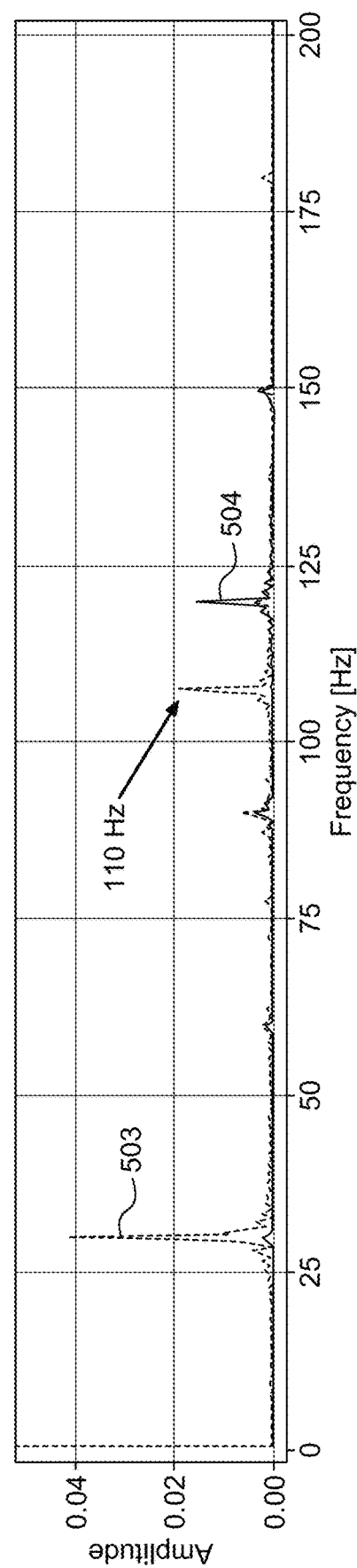

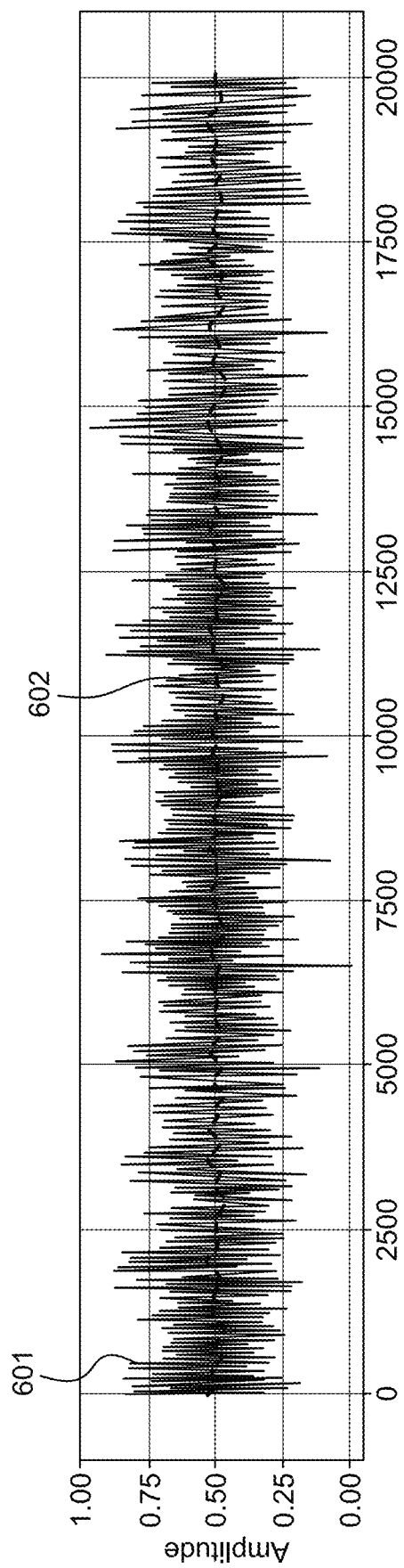
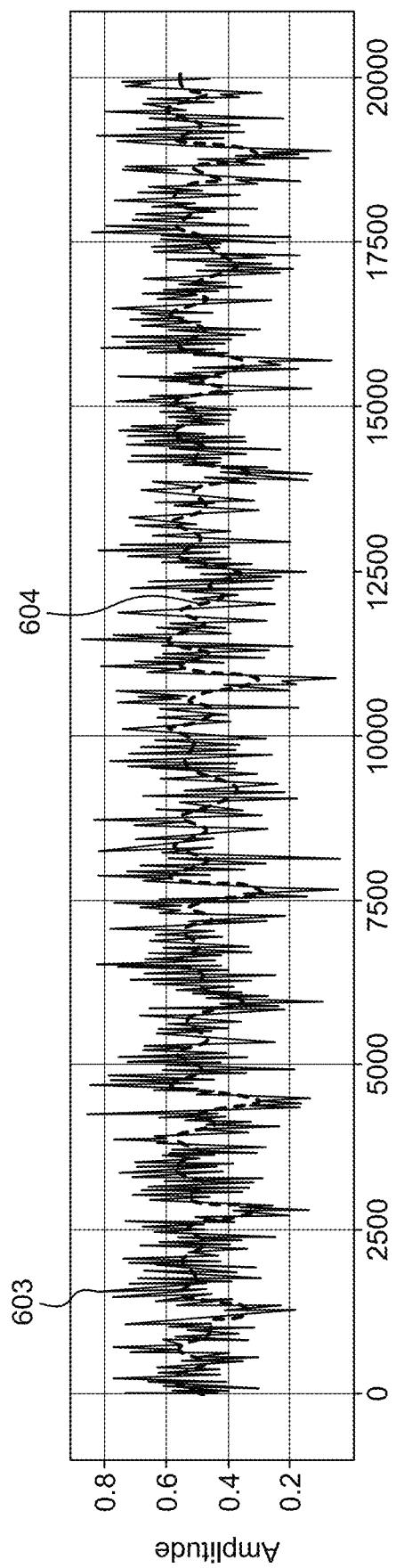
FIG. 6A
FIG. 6B

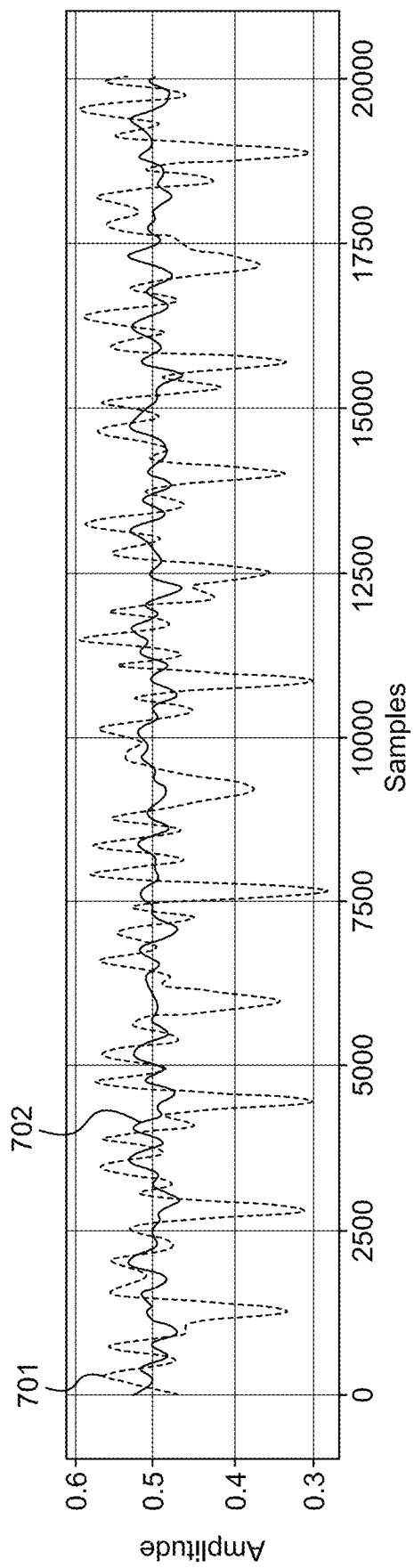
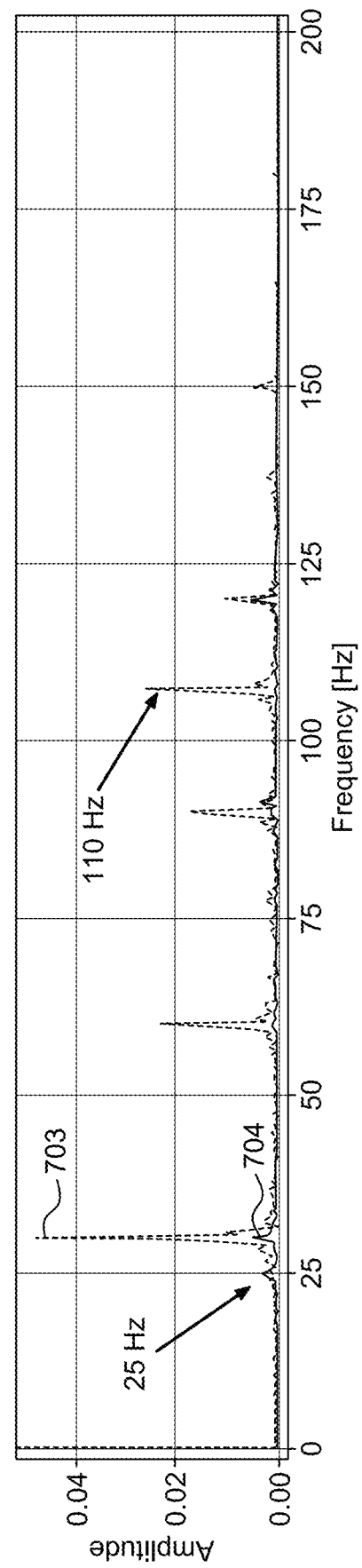
FIG. 7A
FIG. 7B

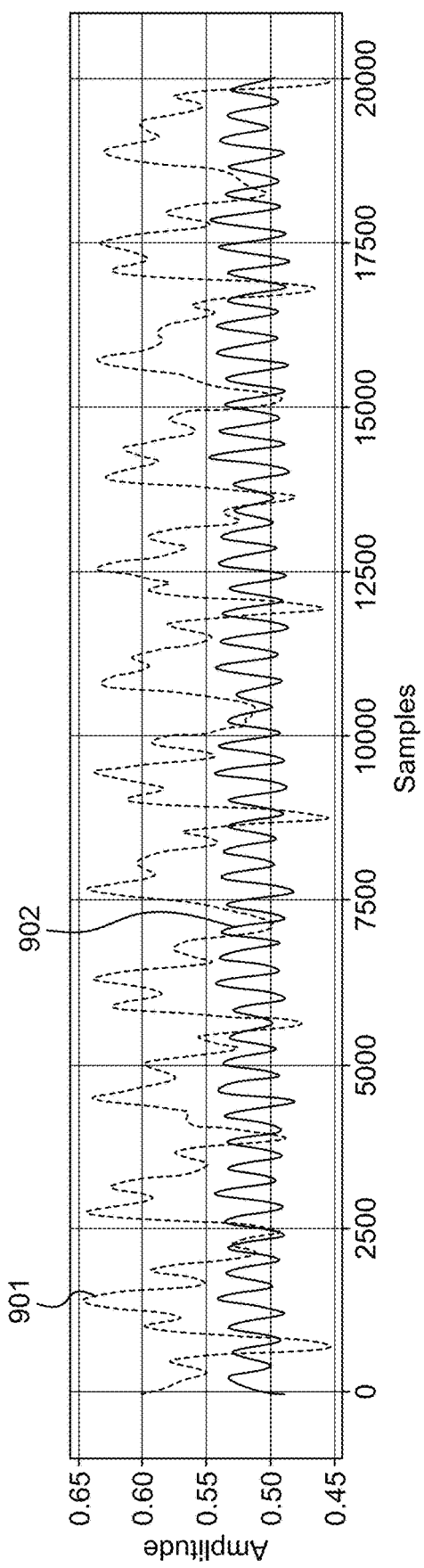
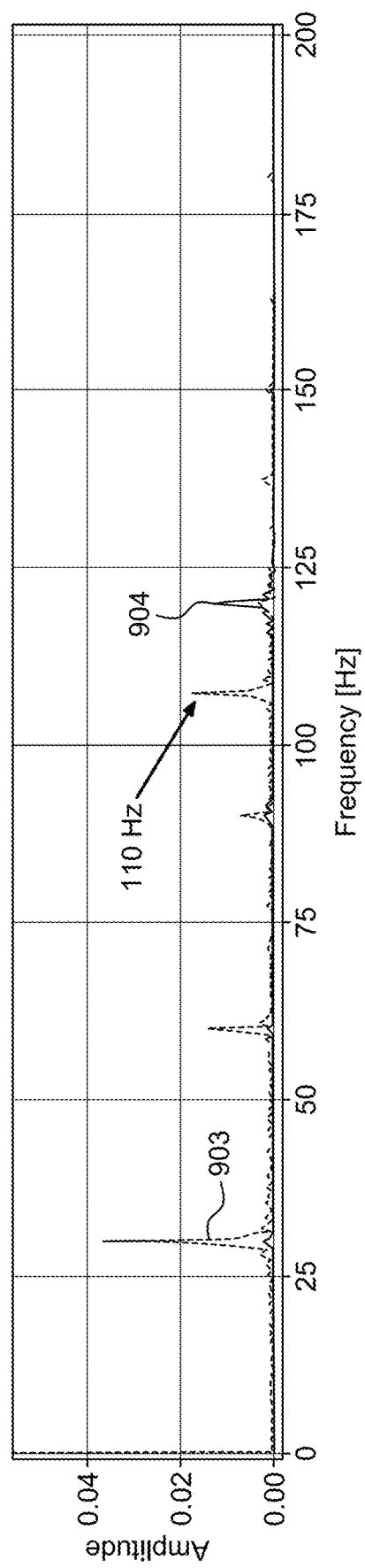
FIG. 9A
FIG. 9B

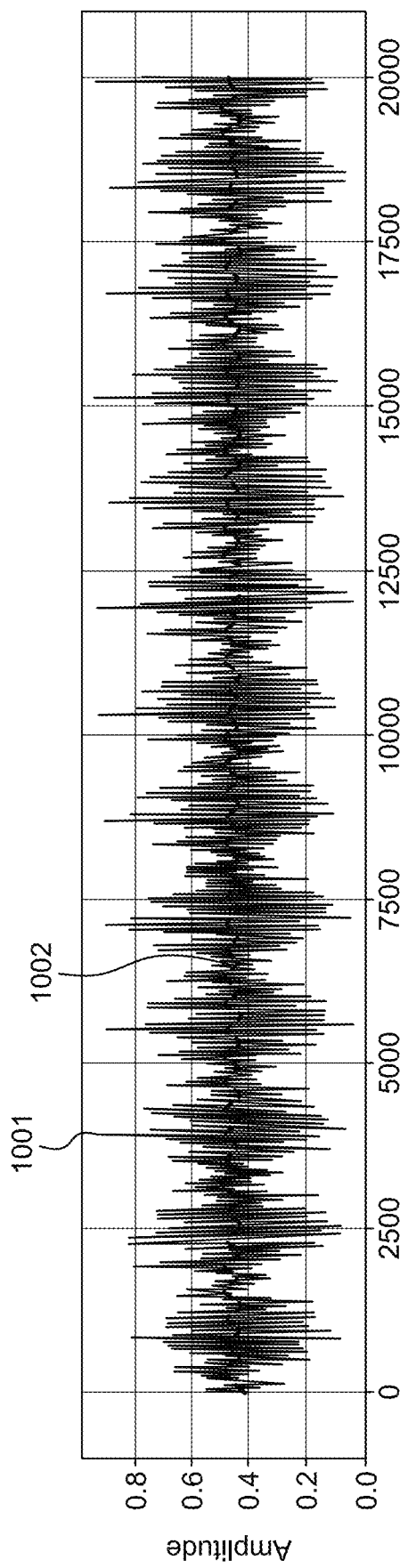
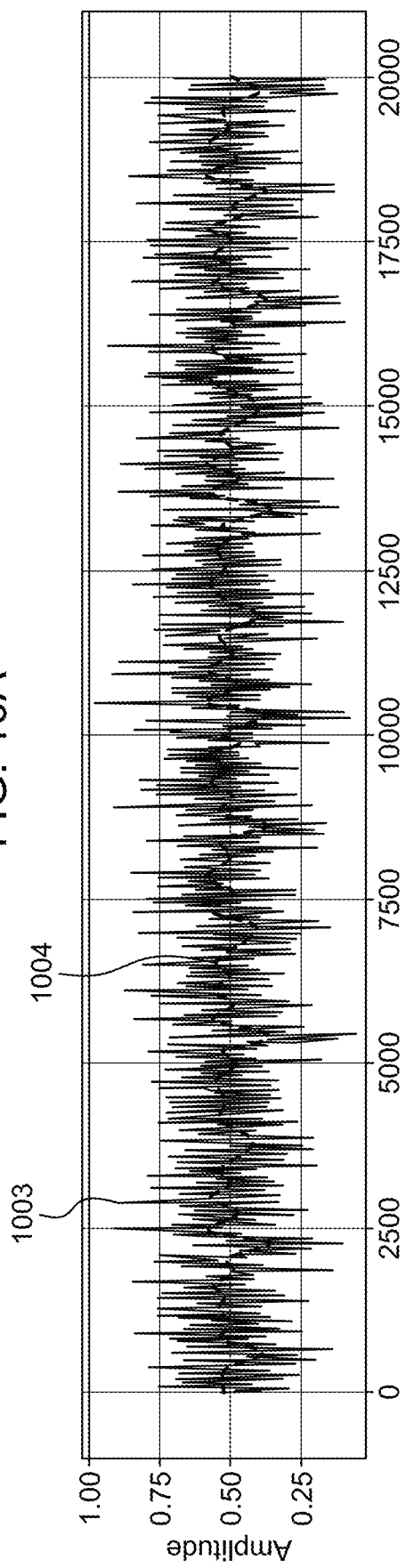

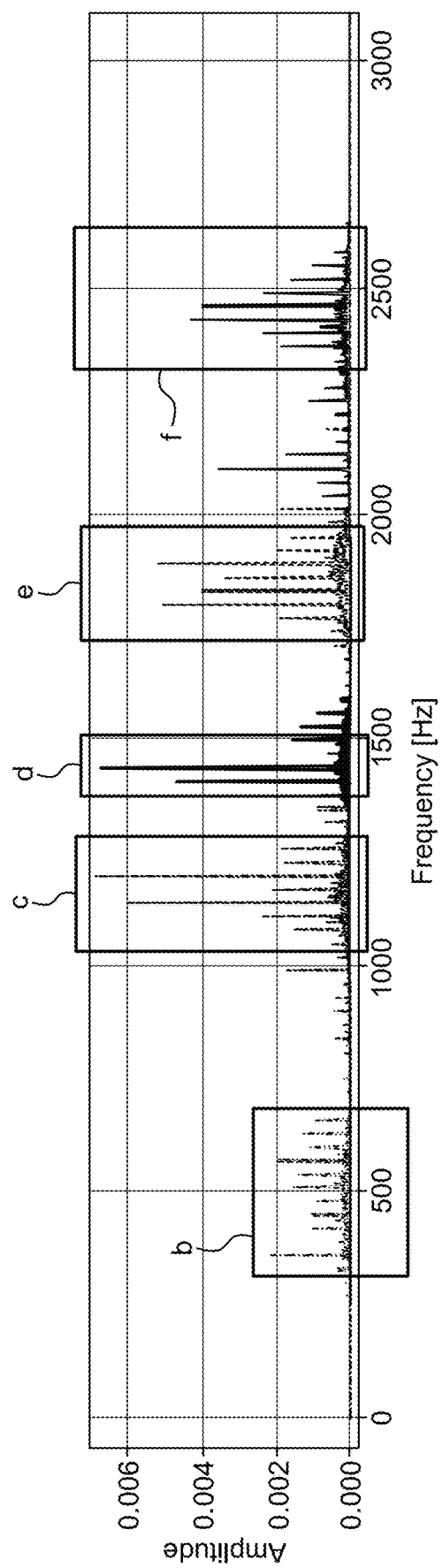
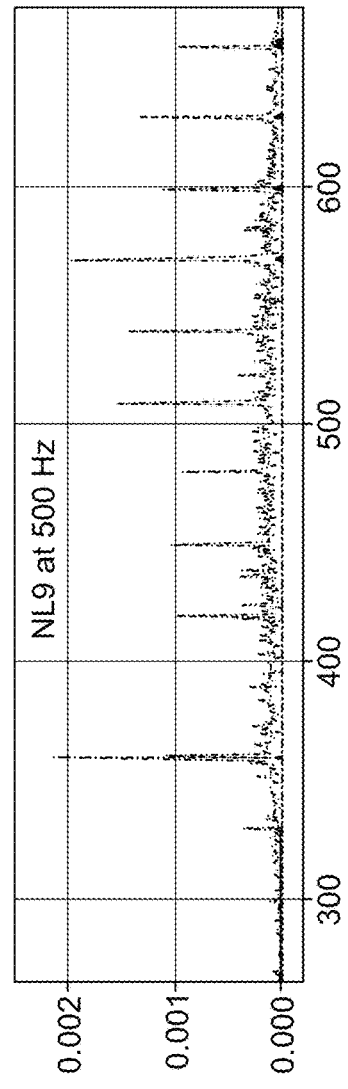
FIG. 15A
FIG. 15B

SYSTEM AND METHOD FOR DIAGNOSING STATOR INTER-TURN FAULTS IN SYNCHRONOUS MOTORS

CROSS-REFERENCE TO RELATED APPLICATION

The present application claims benefit of priority to U.S. Provisional Application No. 63/254,310, having a filing date of Oct. 11, 2021, which is incorporated herein by reference in its entirety.

STATEMENT OF PRIOR DISCLOSURE BY AN INVENTOR

Aspects of the present disclosure are described in Maraaba et al., "An efficient acoustic-based diagnosis of inter-turn fault in interior mount LSPMSM," Applied Acoustics 173 (2021), 107661 which is incorporated herein by reference in its entirety.

BACKGROUND OF THE INVENTION

Technical Field

The present disclosure is directed to a system and a method for diagnosing stator inter-turn faults in line start permanent magnet synchronous motors (LSPMSMs) using acoustic signals.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Usage of Line Start Permanent Magnet Synchronous Motors (LSPMSMs) in industry is increasing due to LSPMSMs' promising features, particularly high efficiency (low $CO_2$ emissions), high operational power factor, power density, operational torque, low operational temperature, and self-starting capability. LSPMSM is also known as an excellent choice for reduction in energy consumption.

In general, synchronous motors comprise a rotor and a stator. The rotor and stator interact electromagnetically such that rotation of the rotor is obtained. Due to internal and external stresses such as damages to insulation material, inefficient cooling, voltage stress, overloading, chemical contamination and partial discharge, the motor can experience several types of faults, such as inter-turn faults, eccentricity, broken bars and demagnetization. An inter-turn fault is a winding fault. A winding fault can occur when a portion of insulation surrounding individual windings wears down and a short circuit occurs between conductors. Such winding faults effectively reduce the number of turns in the affected phase of the three-phase motor, thereby resulting in unbalanced motor, reduced performance of the motor, and/or damage to the motor.

Conventionally, many monitoring methods are employed to measure stator current and synchronous motor vibration to determine the presence of a fault in the synchronous motor. Stator current measurements are performed under the high voltage conditions, which may require expensive sensors capable of withstanding such harsh conditions. Furthermore, results obtained from measurements of synchronous motor vibration and their respective vibration levels do not reflect real conditions of the synchronous motors in a satisfactory manner.

There are many existing diagnostic tools that predict such defects and faults at their early stages in synchronous motors. However, these diagnosis tools mainly focus on rotor faults and demagnetization. These tools consider motor current signature (MCS), instantaneous angular speed (IAS), acoustic signature (AS) and surface vibration signature (VS) as parameters to identify motor faults. For detecting faults using an acoustic signal, some existing tools use line spectral frequencies and K-nearest classifier with Minkowski distance, and other tools use Symlet wavelet transform and modified classifier based on words. However, these tools fail to provide a cost effective and accurate system.

Accordingly, it is one object of the present disclosure to provide a system and a method for diagnosing stator inter-turn faults in line start permanent magnet synchronous motor using acoustic signals in an accurate and efficient manner.

SUMMARY

In an exemplary embodiment, a method diagnosing stator inter-turn faults in a Line Start Permanent Magnet Synchronous Motor (LSPMSM) is disclosed. The method includes collecting acoustic signals that are generated from a LSPMSM by a communication device. The method includes analyzing the collected acoustic signals for fault detection of the stator inter-turn faults via singular spectrum analysis (SSA). The method further includes determining a fault diagnosis for the fault detection by executing a Fast Fourier Transform (FFT). In some aspects, the LSPMSM comprises a stationary stator, comprising stator windings, and a rotating rotor, comprising permanent magnets, and wherein the inter-turn faults occur when the stator windings are shorted.

In another exemplary embodiment, a system for diagnosing stator inter-turn faults in Line Start Permanent Magnet Synchronous Motor (LSPMSM). The system includes a communication device for collecting acoustic signals that are generated from the LSPMSM, a fault diagnosing unit comprising at least one processor capable of analyzing the collected acoustic signals by a singular spectrum analysis (SSA) for fault detection of the stator inter-turn faults, and determining a fault diagnosis for the fault detection by executing a Fast Fourier Transform (FFT). In some aspects, the LSPMSM comprises a stationary stator, comprising stator windings, and a rotating rotor, comprising permanent magnets, and wherein the inter-turn faults occur when the stator windings are shorted.

In another exemplary embodiment, a non-transitory computer readable medium having instructions stored therein that, when executed by one or more processors, cause the one or more processors to perform a method to diagnose stator inter-turn faults in a Line Start Permanent Magnet Synchronous Motor (LSPMSM). The method includes collecting acoustic signals that are generated from the LSPMSM. The method includes analyzing the collected acoustic signals via singular spectrum analysis (SSA) to obtain a fault analysis of the stator inter-turn faults. The method further includes determining a fault diagnosis for the fault analysis by executing a Fast Fourier Transform (FFT). In some aspects, the LSPMSM comprises a stationary stator, comprising stator windings, and a rotating rotor, comprising permanent magnets, and wherein the inter-turn faults occur when the stator windings are shorted.

The foregoing general description of the illustrative embodiments and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein:

FIG. 5A represents a comparison of the first component in time domain for the healthy motor in NL and FL conditions, according to aspects of the present disclosure;

FIG. 5B represents a comparison of the first component in frequency domain for the healthy motor in NL and FL conditions, according to aspects of the present disclosure;

FIG. 6A represents a set of samples of a first component for a 4-turn shorted motor in NL condition, according to aspects of the present disclosure;

FIG. 6B represents a set of samples of a first component for a 4-turn shorted motor in FL condition, according to aspects of the present disclosure;

FIG. 7A represents a comparison of the first component in time domain for the 4-turn shorted motor in NL and FL conditions, according to aspects of the present disclosure;

FIG. 7B represents a comparison of the first component in frequency domain for the 4-turn shorted motor in NL and FL conditions, according to aspects of the present disclosure;

FIG. 9A represents a comparison of the first component in time domain for the 9-turn shorted motor in NL and FL conditions, according to aspects of the present disclosure;

FIG. 9B represents a comparison of the first component in frequency domain for the 9-turn shorted motor in NL and FL conditions, according to aspects of the present disclosure;

FIG. 10A represents a set of samples of a first component for a 26-turn shorted motor in NL condition, according to aspects of the present disclosure;

FIG. 10B represents a set of samples of a first component for a 26-turn shorted motor in FL condition, according to aspects of the present disclosure;

FIG. 15A represents FFT of the $11^{th}$ component of FL acoustic signal corresponding to various frequencies, according to aspects of the present disclosure;

FIG. 15B represents FFT of the $11^{th}$ component of FL acoustic signal corresponding to FL 9-turn fault at 500 Hz, according to aspects of the present disclosure;

DETAILED DESCRIPTION

Figure 1:
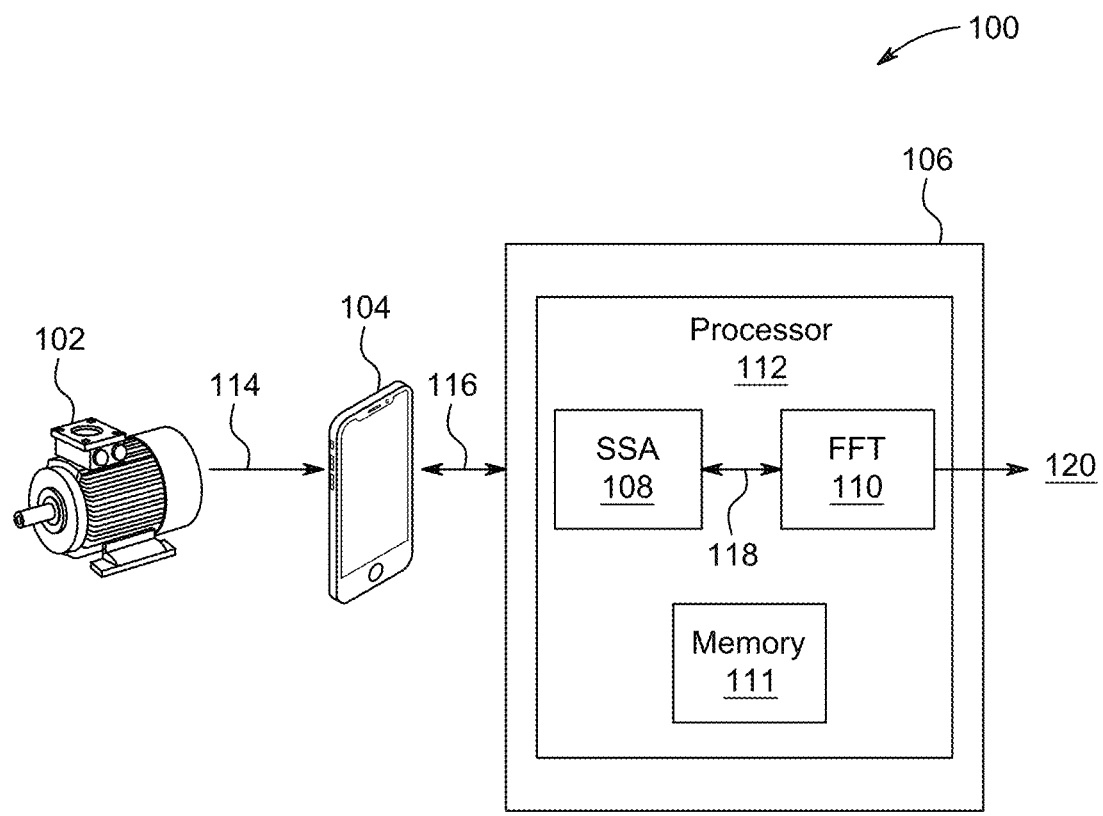
FIG. 1 illustrates a block diagram of a system for diagnosing stator inter-turn faults in a line start permanent magnet synchronous motor, according to aspects of the present disclosure.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

Aspects of this disclosure are directed to a system and a method for diagnosing stator inter-turn faults in a line start permanent magnet synchronous motor. The disclosure provides a solution for detecting the fault in the synchronous motor using acoustic signals. A smart phone (having at least one sensor) is used to collect acoustic signals, resulting from inter-turn faults, from the synchronous motor under the full-load and no-load modes of operation with different severity levels, and analyze the collected data using singular spectrum analysis (SSA) to identify their distinct features.

In various aspects of the disclosure, non-limiting definitions of one or more terms that will be used in the document are provided below.

A term "singular spectrum analysis (SSA)" is a simple spectral method that may be capable of analyzing acoustic signals for fault detection. An advantage of SSA is that it does not need a priori assumptions about the model structure or any statistical requirements from the signal or time series to be analyzed. SSA can decompose a signal into trend, oscillatory and noise components to provide a time series analysis. Fault detection may be referred to as "fault analysis".

The term "communication device" may comprise an acoustic sensor and therefore capable of acquiring acoustic data from the motor, i.e., LSPMSM. The communication device may operate in a continuous real-time monitoring mode or periodic monitoring mode. The communication device is further capable of transmitting the acquired acoustic data to another device such as a fault diagnosing unit. The communication device may communicate with another device via a wired or wireless connection. Wireless communication may occur via media including near field antenna (Bluetooth), a Wi-Fi (Wireless-Fidelity) antenna, and an RF antenna. In some embodiments, the communication device is a smartphone.

The term "permanent magnet motor" may comprise a stationary part called the stator, and a rotating part called the rotor. Associated with the stator are stator windings and associated with the rotor are magnets. A permanent magnet motor uses permanent magnetics on the rotor. The alternating current applied to the stator results in rotation of the rotor. Because the magnets are permanently magnetized, the rotor can run synchronously to the switching AC current. A LSPMSM is a type of permanent magnet motor.

The term "motor load" may be defined as follows: A motor is a device that converts electrical energy into mechanical energy to act upon a mechanical load. The burden placed on the motor due to this mechanical activity is referred to as the motor load. Electric motors maybe be designed to run at 50% to 100% of their rated load. Maximum efficiency may be near 75% of rated load. A no-load current is the current required just to turn the motor shaft with no mechanical load, i.e., nothing connected to the motor shaft. The maximum load (full-load) current is the maximum continuous current that can be used to continuously drive a load.

The term "turns" (or "windings") may refer to how much wire is wrapped inside of a motor. As noted above, for a permanent magnet motor, the turns (windings) are located on the stator. A "turn" is a length of winding needed to fully wrap a circumference.

The term "shorted turns" may result from failed insulation between individual windings in generator rotors. Stop-Start cycles, line disturbances, contamination, moisture, manufacturer error and damage during retaining ring installation are some of the reasons insulation fails. The impact of operating with shorted turns ranges from no-problem to abnormal vibration, load limits, higher operating temperatures and forced outages. The location and number of shorted turns in a rotor determines the magnitude of the effects of running a rotor with shorted turns.

The term "stator inter-turn fault" or simply "inter-turn fault" may refer to a fault that occurs when a short occurs between two turns which are close to each other in a stator winding. This may have occurred be due to insulation failure in the stator windings. An inter-term fault can also be called an "inter-turn short circuit fault", or a "stator winding fault". An inter-turn fault occurs when either a total or a partial of the stator windings are shorted.

LSPMSM is further discussed in "Comprehensive Parameters Identification and Dynamic Model Validation of Interior-Mount Line-Start Permanent Magnet Synchronous Motors", Luqman S. Maraaba, et al., MDPI Journals/Machines, published: 7 Jan. 2019, which is incorporated by reference.

FIG. 1 illustrates a block diagram of a system 100 (hereinafter interchangeably referred to as "the system 100") for diagnosing stator inter-turn faults in a Line Start Permanent Magnet Synchronous Motor (hereinafter referred to as "LSPMSM") 102, according to one or more aspects of the present disclosure. Referring to FIG. 1, the system 100 includes the LSPMSM 102, a communication device 104, and a fault diagnosing unit 106.

The LSPMSM 102 includes of a stator and a rotor having a permanent magnet for excitation. LSPMSM 102 has been developed to achieve high operational efficiency and starting capability. In some embodiments, LSPMSM is preferably equipped with a squirrel cage to rotate the rotor from a stationary position with the magnets assisting the motor to maintain the synchronous speed.

Unlike the synchronous motor, there is no winding on the rotor of the LSPMSM 102. The LSPMSM 102 uses permanent magnets embedded in the rotor to create a constant magnetic field. The stator carries windings connected to an AC supply to produce a rotating magnetic field. At synchronous speed, rotor field poles lock with the rotating magnetic field to produce torque and hence the rotor continues to rotate. In an aspect, the LSPMSM 102 is configured to generate acoustic signals 114. According to an aspect, the generated acoustic signals 114 represent the condition of the LSPMSM 102. For example, the generated acoustic signals 114 may indicate whether the motor is working in Full-Load (FL) or No-load (NL). Over time and with use of the motor, the generated acoustic signals 114 may vary and represent the real-time working condition of the motor. The generated acoustic signals 114 are affected by the size of the fault and the surrounding background noise. In one embodiment of the present disclosure, the motor is analyzed under different loading levels, a different number of turns are shorted to emulate different fault levels, such that different acoustic signals 114 are produced representing the different fault levels. According to an aspect, in order to improve the effectiveness of the fault detection, the acoustic signals 114 for different fault severities with different background noise are collected by the communication device 104. Hence, the collected acoustic signals comprise information based on loading levels of the LSPMSM, and number of turns shorted in the stator winding.

The communication device 104 can be configured to collect the generated acoustic signals 114 from the LSPMSM 102. In an operative embodiment, the communication device 104 includes a microphone for recording the acoustic signals 114 that are generated in proximity of the communication device 104. The communication device 104 is configured to collect the acoustic signals 114 corresponding to different loading levels. For example, the communication device 104 is capable of recording acoustic signals when the motor is operating on variable loads. In an aspect of the present disclosure, communication device 104 includes communication capabilities, allowing communication with other devices and/or a centralized server. Communication device 104 can support a wired connection and/or a wireless connection Wireless connection can include, but not limited to, a cellular connection, e.g., 4G/5G technology, a Bluetooth connection or a Wi-Fi connection. Additionally, and without limitation, the communication device 104 may take a form of a mobile device, PDA, desktop computer, a cellular telephone, a tablet, a netbook, a wireless terminal, a laptop computer, a wearable computer device, or any other device. In an aspect, the communication device 104 is mounted on the LSPMSM 102 or the communication device 104 is positioned in proximity to the LSPMSM 102 such that the acoustic sensor (e.g., microphone) of the communication device 104 is able to receive the acoustic signals 114.

In another aspect, the communication device 104 can be acoustically coupled to the LSPMSM 102, such that the communication device 104, comprising a digital voice recorder, is capable of recording/collecting the acoustic signals 114 clearly from the LSPMSM 102. LSPMSM 102 and communication device 104 can be acoustically coupled based on the strength of the audio signal emitted by LSPMSM 102, the sensitivity of the acoustic sensor, and the distance between LSPMSM 102 and communication device 104.

Further, the communication device 104 is configured to save the recordings as audio file(s). In an aspect of the present disclosure, the time duration of each recording is 2 seconds (2 s). In a further aspect, the time duration of each recording can be varied as required.

According to an aspect of the present disclosure, the communication device 104 may be configured to collect the acoustic signals 114 continually or may be configured to collect the acoustic signals 114 after a predetermined time-interval. In an aspect, the acoustic signals may be analog or digital and the form of an audio file formatted, for example, as 'mp3', 'mp4', 'wma', and/or 'wave.

The communication device 104 can be communicatively coupled to the fault diagnosing unit 106 for transmitting the saved audio files corresponding to the collected acoustic signals 116. In an aspect, the communication device 104 is configured to store the audio files on a local memory of the communication device 104. In another aspect, the communication device 104 is configured to transmit the saved audio files simultaneously to the fault diagnosing unit 106, for diagnosing the fault in the LSPMSM 102 in a real-time. In a further aspect, the communication device 104 may be configured to transmit the saved audio files to a remotely placed server for further processing such as storing the historical files. According to an aspect, the communication device 104 may facilitate diagnosing stator inter-turn faults in LSPMSM 102.

The fault diagnosing unit 106 has circuitry including a memory 111 for storing program instructions and at least one processor 112 configured to perform the program instructions. The at least one processor 112 is equivalent to "one or more processors", as used herein. According to an aspect of the present disclosure, the at least one processor 112 may be implemented as microprocessors, microcomputers, microcontrollers, digital signal processors, central processing units, state machines, logic circuitries, and/or any devices that manipulate signals based on operational instructions. Among other capabilities, the at least one processor 112 may be configured to fetch and execute computer-readable instructions stored in the memory.

The memory 111 may be coupled to the at least one processor 112 and may include any computer-readable medium known in the art including, for example, any type of disk, including floppy disk, optical disk, CD-ROM and magneto-optical disk, read only memory (ROM), random access memory (RAM), EPROM, EEPROM, magnetic or Optical card, any type of medium suitable for storing electronic instructions, but is not limited to these.

The at least one processor 112 may be configured to receive the audio files transmitted by the communication device 104 and is further configured to analyze the received files for detecting any error in the LSPMSM 102. The at least one processor 112 is configured to analyze the received files by employing singular spectrum analysis (SSA) 108 for detecting stator inter-turn faults. The SSA 108 is configured to generate a fault analysis 118 of the stator inter-turn faults. Fault analysis 118 represents the fault detection of stator inter-turn faults. In an aspect of the present disclosure, the fault analysis 118 differentiates between load and no-load modes of operation. The SSA 108 can detect the stator inter-turn faults under different loading levels.

In an aspect of the present disclosure, before employing the files under the SSA 108, the fault diagnosing unit 106 is configured to pre-process/pre-condition the received files (i.e., collected acoustic signals 116) to generate a clean dataset for further processing. In an aspect, the pre-processing may include segmentation, Gaussian filter, binarization, regularization, and/or normalization. For example, the acoustic signals collected by the communication device 104 may be pre-conditioned. At a minimum, the acoustic signals will typically be amplified to make the acoustic signals usable in further processing stages. The acoustic signals may be compressed with an automatic gain control system, or other means in order to normalize the energy envelopes. The acoustic signals can additionally be filtered to remove noise, or to highlight frequency bands of particular interest in the application. In an aspect, the communication device 104 may be configured to employ pre-processing of the collected acoustic signals 116 before storing and generating the audio file. Pre-processing of the collected acoustic signals 116 may reduce the processing time required by SSA 108. According to an aspect, the pre-processing of the file includes removing mean from each time-series of the acoustic signal and also normalizing them between 0 and 1.

To perform the decompression of the file having the acoustic signals into two parts, namely periodic components and noise, the SSA 108 includes non-limiting four steps:

Firstly, received acoustic signal or time-series is structured in a matrix form, called a trajectory matrix, where number of rows in the matrix is equal to the desired number of components in which the received acoustic signal has to be decomposed.

Secondly, singular value decomposition (SVD) is applied to the trajectory matrix for decomposition.

Thirdly, component matrices (product of eigen-vectors and respective singular values), is obtained. The obtained component matrices are then combined to a group related, similar, or desired periodicities or patterns in the signal. The grouping of the related components focuses on particular characteristics of the time-series, which would enhance specific periodicity.

Fourthly, a matrix is reconstructed from the component's time-series.

In an aspect, a component defined as an element that gives the unique frequency for each case under study is selected for load and fault characterization. Briefly, the SSA 108 decomposes the received acoustic signal into a trend, oscillatory components, and noise. According to an aspect of the present disclosure, the number of components or window length L for the SSA 108 is selected after analysis of the data/audio files, and trials with various values during experimentation of the present system 100. For example, the computational time and frequency content of the obtained components were observed; L of 200 samples was selected. This takes a reasonable amount of computational time and results in distinct frequencies for each case. This was followed by conventional SVD, elementary grouping, and reconstruction by diagonal averaging. Once the components were obtained after the SSA 108, the Fast Fourier Transform (FFT) 110 was employed to reveal a fault diagnosis 120.

As the SSA 108 does not need any prior assumptions or any statistical data from the signal or time series to be analyzed, thereby the present system 100 yields a simple and self-sufficient system. The SSA 108 is an efficient technique for the time series analysis. In an aspect, the SSA 108 can be used as a stand-alone decomposition tool or in combination with other algorithms for further improvement of the results. Hence, SSA 108 can be a hardware component that is separate from the at least one processor 112. Or SSA 108 can be a software component that is executed by the at least one processor 112.

Further, fault analysis 118 comprises the components of acoustic signal (periodic components and noise) that are obtained from the SSA 108. These components are analyzed in the frequency domain by using the FFT 110 to obtain a fault diagnosis 120. Particularly, the FFT 110 of each of the periodic components is executed to determine a number representing a unique frequency for each fault case.

In the present disclosure, the characteristics of the acoustic signal produced by various severity levels of faults indicate that there can be a potential for effective fault diagnosis. With this objective, the present system 100 uses the communication device 104 to collect the acoustic signals 114 resulting from inter-turn faults under the full-load and no-load modes of operation with different severity levels, and analyze the collected acoustic signals 116 using the SSA 108 to identify their distinct features.

The FFT 110 diagnoses the detected faults according to fault severity based on the detected stator inter-turn faults. In an aspect, each fault case is based on a number of shorted turns and a loading level. In the present system 100, the fault detection determines an occurrence of inter-turn fault under different loading levels, whereas the fault diagnosis 120 distinguishes the fault severity.

In summary, SSA 108 detects the stator inter-turn faults under different loading levels and the FFT 110 provides a diagnoses fault severity based on the detected stator inter-turn faults. In an operative aspect, the fault diagnosing unit 106 is operatively connected to a database. The database is configured to store a predefined set of frequencies, where each frequency has a corresponding fault signature. The predefined set of frequency and fault signature is based on the data collected and analyzed by the fault diagnosing unit 106. The fault signature indicates a condition that is representative of a particular fault.

Once the fault is detected by the fault diagnosing unit 106, the fault is analyzed by the fault diagnosing unit 106. According to an aspect, the fault diagnosing unit 106 is configured to compare the number provided by the FFT 110 with each stored fault signature fetched from the database. After comparing the number, the fault diagnosing unit 106 may be configured to display the fault signature that matched with the number. For example, the FFT 110 outputs a frequency "y" Hz. Then the fault diagnosing unit 106 is configured to compare the result with the frequencies stored in the database. The "y" Hz can match with one of the frequencies stored in the database and shows the fault signature reciting "No load, 40 turns shorted".

According to an aspect, the fault diagnosing unit 106 may be configured to generate a fault report that indicates the fault types and is configured to share the generated fault report to one or more clients (not shown) networked with the statistical process monitoring device (for e.g., local computer, remote computer, personal digital assistant (PDA), pager, mobile phone, etc.). The fault diagnosing unit 106 may be configured to turn off the motor and also generate an alert for alerting an operator for taking appropriate actions.

Figure 2:
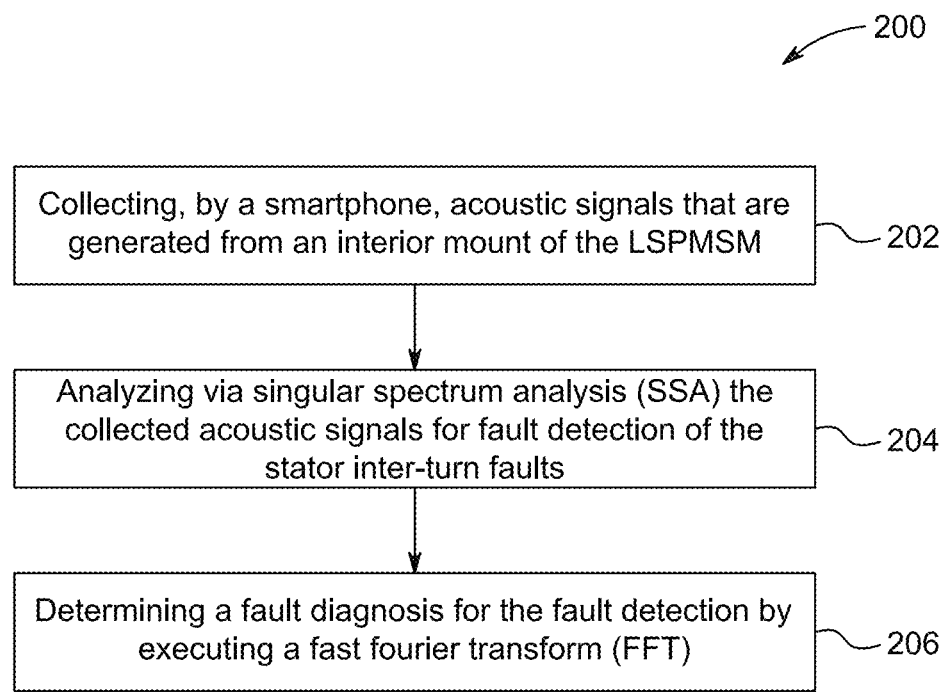
FIG. 2 illustrates a method for diagnosing stator inter-turn faults in a line start permanent magnet synchronous motor, according to aspects of the present disclosure.

FIG. 2 illustrates a method 200 for diagnosing stator inter-turn faults in a Line Start Permanent Magnet Synchronous Motor (LSPMSM), according to one or more aspects.

Step 202 includes collecting acoustic signals 114 that are generated from LSPMSM 102, by a communication device 104. According to an aspect of the present disclosure, the communication device 104 is mounted on the LSPMSM 102. The acoustic signals 114 are collected using the communication device 104 under different loading levels, and wherein a different number of turns are shorted to emulate different fault levels.

Step 204 includes analyzing the collected acoustic signals 116 for fault detection of the stator inter-turn faults is determined via the SSA 108. According to aspects of the present disclosure, the SSA 108 results in decompression of the acoustic signals into periodic components and noise. The fault detection of the stator inter-turn faults, determined via the SSA 108, is represented by fault analysis 118.

Step 206 includes determining a fault diagnosis 120 for the fault detection by executing a Fast Fourier Transform (FFT). According to an aspect of the present disclosure, a FFT of each of the periodic components is executed to determine a unique frequency represented for each fault case.

EXAMPLES AND EXPERIMENTS

The following examples are provided to illustrate further and to facilitate the understanding of the present disclosure.

In the present disclosure, for experiment 1.0 Hp interior mount LSPMSM was used. A tabular representation of parameters is illustrated in Table 1 provided below.

TABLE 1

Parameters of LSPMSM motor

| Parameters | Value |
|---|---|
| Number of Poles | 4 |
| Number of turns per stator phase | 86 * 4 |
| Number of bars | 20 |
| Permanent magnet flux Density | 1.25 T |
| Machine rated power | 1 hp |
| Rated voltage | 400 $V_{rms}$ |
| Rated frequency | 60 Hz |
| Rated speed | 1800 rpm |

Experimental Data and Analysis

Figure 3:
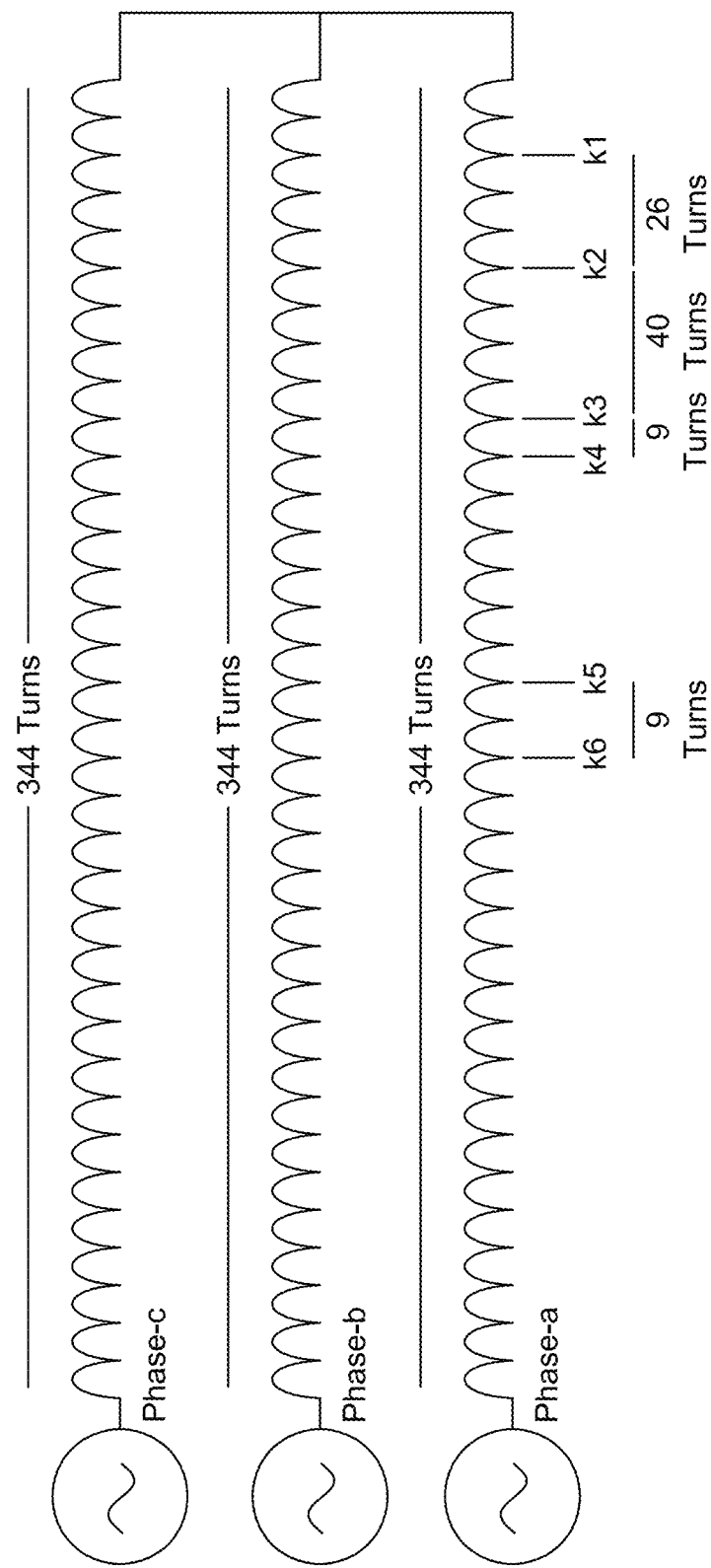
FIG. 3 illustrates an experimental setup for a fault illustration for LSPMSM, according to aspects of the present disclosure.

FIG. 3 illustrates an experimental setup for a fault illustration for LSPMSM.

In order to extract the distinct frequency components related to the inter-turn faults and their severity under loading and non-loading conditions, ten operating cases were considered: five shorted-turn cases for a full-load condition and another five cases for a no-load condition. Each case was collected for a period of two seconds, representing 96,000 samples at a sampling frequency of 48,000 samples per second. Different sizes of the inter-turn faults were implemented to the interior mount LSPMSM used. The measured cases of the motor are as follows:

healthy case (no shorted turns);
4 shorted turns;
9 shorted turns;
26 shorted turns; and
40 shorted turns.

All experiments were performed by considering the motor at the NL and the FL (4.0 N.m) with background noise which included the sound of other machines operating in the laboratory and human noise. Further, to achieve the stator inter-turn fault experimentally by adding six access points are added to phase-A as shown in FIG. 3, which were labeled by the letter ki. For example, to emulate 26 shorted turns, k1 and k2 were connected through the resistance (fault resistance). The resistance was used to limit high short circuit current in the shorted turns. During experiments, all electric data of the motor was measured as well as the audible noise was recorded using a communication device 104 mounted on the LSPMSM 102.

In an aspect, the communication device 104 is configured to store all the measured data and audible signal at 48,000 samples per second using waveform capture capability to generate a number of files. According to an aspect, the filenames for each measured acoustic signal are listed in Table 2.

TABLE 2

Files having acoustic signals and their description.

| Filename | Description |
|---|---|
| nlh | No load, healthy motor |
| nl4 | No load, 4 turns shorted |
| nl9 | No load, 9 turns shorted |
| nl26 | No load, 26 turns shorted |
| nl40 | No load, 40 turns shorted |
| flh | Full load, healthy motor |
| fl4 | Full load, 4 turns shorted |
| fl9 | Full load, 9 turns shorted |
| fl26 | Full load, 26 turns shorted |
| fl40 | Full load, 40 turns shorted |

In an aspect, each file lasted for two seconds or 96,000 samples at the sampling frequency of 48,000 samples per second. For the present experiment, Python 3.7.4 64-bit was used for implementation of SSA algorithm on Windows 10 platform with Intel Core i5, 3.4 GHz processor, and 8 GB RAM. Further, in order to efficiently perform grouping and diagonal averaging steps during the SSA 108, only the first 30 elementary matrices were selected (out of 200) to go through the averaging process, as all the components beyond 30 were unstructured noise. Furthermore, algorithmic changes were made in Python code to perform fast diagonal averaging.

In an aspect of the present disclosure, a first component of SSA decomposition characterized the loading condition by showing 30 Hz and its harmonics for NL, and an additional 110 Hz component for full-load. Further, distinct frequencies were observed for healthy and faulty conditions in $18^{th}$ SSA component for NL, and $11^{th}$ component for FL operation.

First Experiment: Determining the No-Load and Full-Load Conditions of a LSPMSM The first experiment is carried out for differentiating no-load and full-load conditions for the LSPMSM 102. The fault diagnosing unit 106, using the SSA 108, is configured to differentiate between fault severities under no-load and full-load applications. Therefore, the first step is differentiating between the NL or FL cases in both healthy and faulty conditions of the motor. In an aspect, the SSA 108 may be applied on the collected acoustic signals 116 by the communication device 104 for all these cases. Then, the FFT 110 of the first thirty components was observed for distinct frequencies pertaining to the load characteristics of the motor. To test the applicability of the disclosed method, an algorithm was applied on multiple windows of the 2 s data with varying the size and placement of each window. This was done since different sources of background noise were present at the time of data collection, which would result in different acoustic characteristics during the same acoustic file. In the healthy and faulty conditions, the FFT 110 of the first component shows workable features for differentiating between the NL and FL modes of operation as illustrated in the following subsections.

Figure 4A:
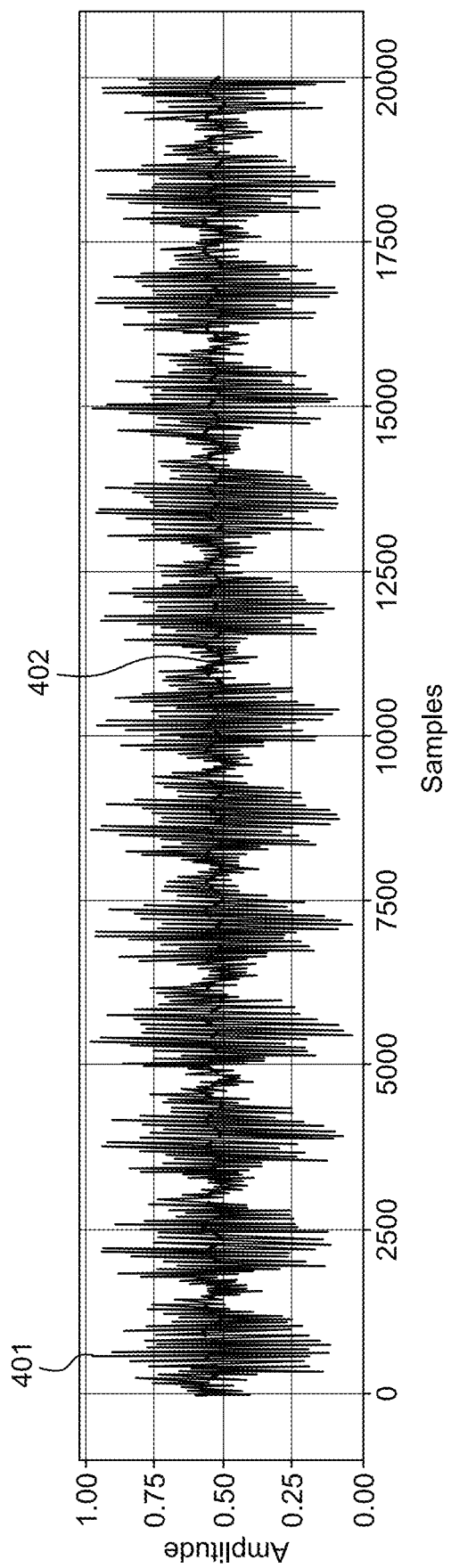
FIG. 4A represents a set of samples of a first component for a healthy motor in No-load (NL) condition, according to aspects of the present disclosure.
Figure 4B:
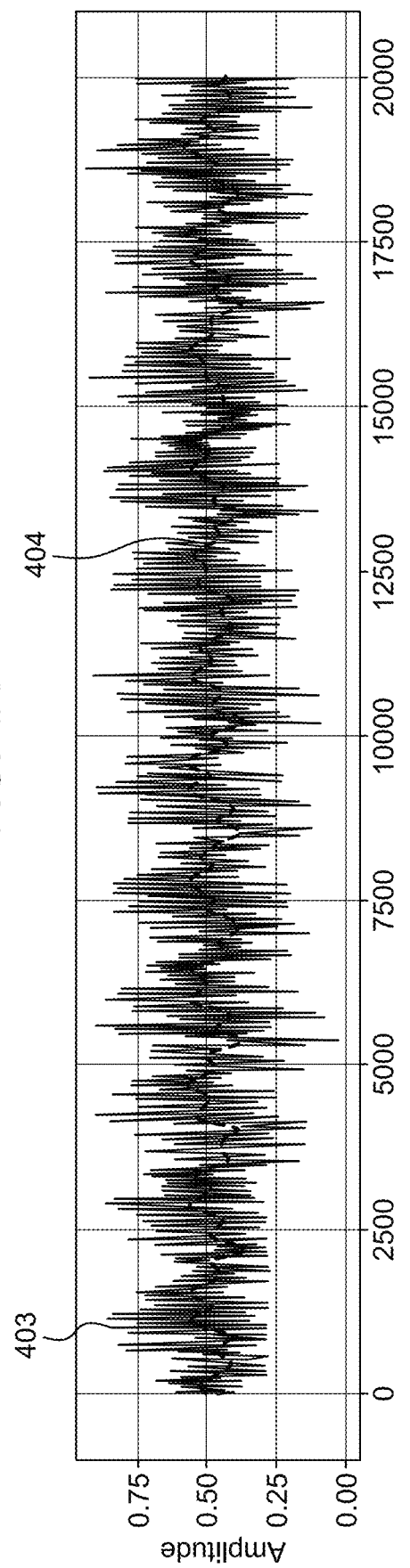
FIG. 4B represents a set of samples of a first component for a healthy motor in a Full-load (FL) condition, according to aspects of the present disclosure.

Healthy Motor:

FIG. 4 and FIG. 5 illustrate the signals related to the healthy motor. For example, FIG. 4A represents two types of signals, where signal 401 indicates original data and signal 402 is a first component for a healthy motor in NL condition. Further, the FIG. 4B represents two types of signals, where signal 403 indicates original data and signal 404 is a first component for the healthy motor in FL condition.

Further, FIG. 5 represents a comparison of the first component in time domain and frequency domain for the healthy motor in NL and FL conditions. In FIG. 5A, signals 501 indicates the first component in NL condition and signal 502 indicates the first component in FL condition for the healthy motor in the time domain. Further, in the frequency domain, signal 503 indicates the first component in FL condition and signal 504 indicates the first component in NL condition for the healthy motor.

For the healthy motor in NL condition, the component shows a periodicity of 30 Hz along with three to four harmonics at 60, 90, 120, and 150 Hz (as shown by signal 503 in FIG. 5B). With a different energy distribution along these frequencies, the first component of healthy FL mode shows an additional 110 Hz frequency (as shown as signal 503 in FIG. 5B), which is prominent with significant energy.

As shown in FIG. 4 and FIG. 5, where the time domain observation of the first component (indicated as signal 502 of FIG. 5A) shows a larger amplitude and distortion for FL case as opposed to NL (indicated as signal 501 of FIG. 5A). Here, the data is zoomed to the first 20,000 samples to ensure better visualization of waveform characteristics. As shown in FIG. 4A, unlike NL case, the deviation from sinusoidal pattern can be attributed mainly to the presence of 110 Hz component, which is not a harmonic of 30 Hz. It is obvious that 110 Hz frequency can be used to differentiate between NL and FL conditions in the healthy motor.

Second Experiment: Determining the 4-Turns Fault in a LSPMSM

FIG. 6 and FIG. 7 illustrate the signals related to 4-turn shorted motor. As described above, the SSA 108 was applied to the data of 4-turn shorted fault. FIG. 6A represents two types of signals, where signal 601 indicates an original data and signal 602 is first component for a 4-turn shorted motor in No load condition. Further, the FIG. 6B represents two types of signals, where signal 603 indicates an original data and signal 604 is first component for a 4-turn shorted motor in full load condition. The results show a similar behavior to healthy case as shown in FIG. 6, and FIG. 7. Further, FIG. 7 represents a comparison of the first component in time domain and frequency domain for the 4-turn shorted motor in NL and FL conditions. In FIG. 7A, signals 701 indicates the first component in FL condition and signal 702 indicates the first component in NL condition for the 4-turn shorted motor in time domain. Further, in frequency domain, signal 703 indicates the first component in FL condition and signal 704 indicates the first component in NL condition for the 4-turn shorted motor.

Higher amplitude and distortions were observed for FL with distinct 110 Hz frequency component (as shown as signal 703 in FIG. 7B) in addition to the fundamental 30 Hz and its harmonics. However, with 4-turn shorted fault, NL operation shows distortions mainly due to a 25 Hz component (as shown as signal 704 in FIG. 7B) with comparable amplitude with that of the 30 Hz. In addition, a difference can be observed between the original data for healthy case in FIG. 4A and 4-turn fault data in FIG. 6A, where FIG. 4A shows repetition of an envelope (signal 401) as opposed to signal 601 as shown in FIG. 6A. First component (signal 701) for the FL case (FIG. 7A) shows a higher amplitude variation as compared to its counterpart as shown as signal 502 in FIG. 5A as healthy case).

Third Experiment: Determining the 9-Turns Fault in a LSPMSM

Figure 8A:
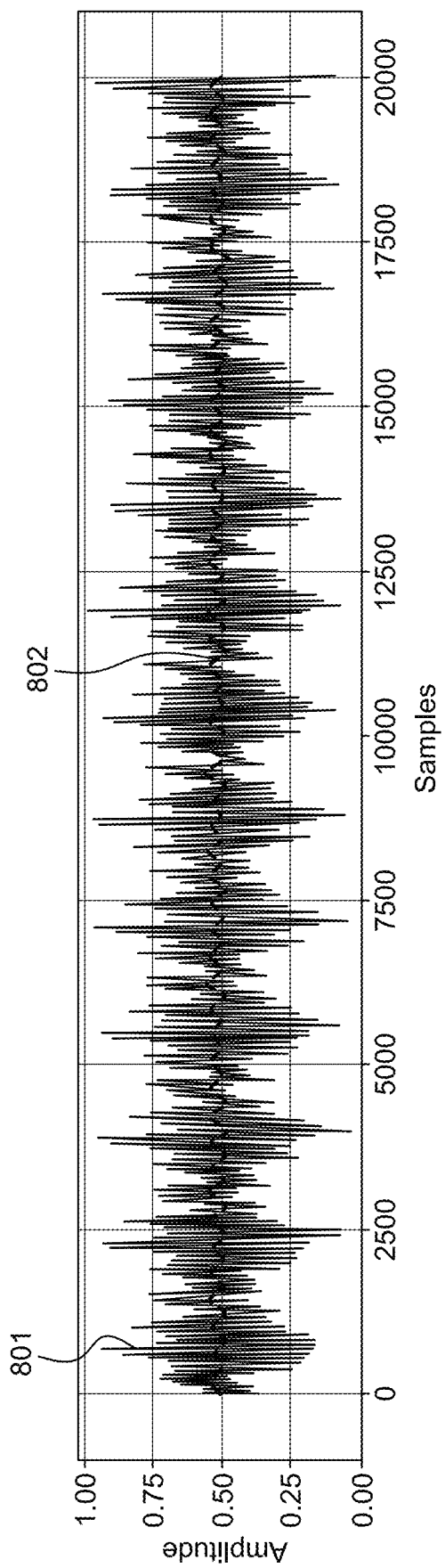
FIG. 8A represents a set of samples of a first component for a 9-turn shorted motor in NL condition, according to aspects of the present disclosure.
Figure 8B:
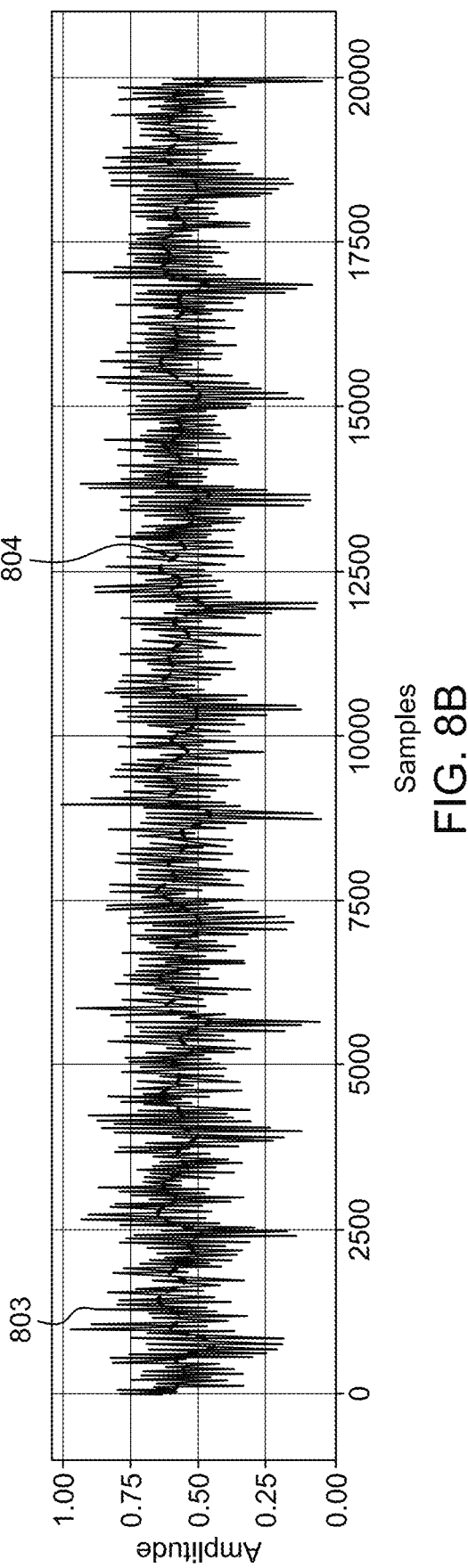
FIG. 8B represents a set of samples of a first component for a 9-turn shorted motor in FL condition, according to aspects of the present disclosure.

FIG. 8 and FIG. 9 illustrate the signals related to 9-turn shorted motor. For 9-turn fault scenario, the NL acoustic signal and its first component show similar behavior as in the healthy case, as observed from the comparison of FIG. 4A with FIG. 8A. FIG. 8A represents two types of signals, where signal 801 indicates an original data and signal 802 is the first component for a 9-turn shorted motor in NL condition. Further, the FIG. 8B represents two types of signals, where signal 803 indicates an original data and signal 804 is the first component for a 9-turn shorted motor in full load condition. In both cases (FIG. 4A with FIG. 8A), similar shaped envelope is followed, and the first component (signal 802) does not show significant distortions from sinusoidal behavior (signal 402). Also, FIG. 9 represents a comparison of the first component in time domain and frequency domain for the 9-turn shorted motor in NL and FL conditions. In FIG. 9A, signal 901 indicates the first component in FL condition and signal 902 indicates the first component in NL condition for the 9-turn shorted motor in time domain. Further, in frequency domain, signal 903 indicates the first component in FL condition, and signal 904 indicates the first component in NL condition for the 9-turn shorted motor.

Moreover, the energy distribution among harmonics is also similar as shown in FIG. 5B (as signal 503), and FIG. 9B (as signal 903). These parallels make the detection of 9-turn fault in no-load case a challenging task. Like the cases discussed above, unlike the NL case, the 110 Hz component can be observed with a significant energy content in FL case (as shown as signal 903 in FIG. 9B).

Fourth Experiment: Determining the 26-Turns Fault in a LSPMSM

Figure 11A:
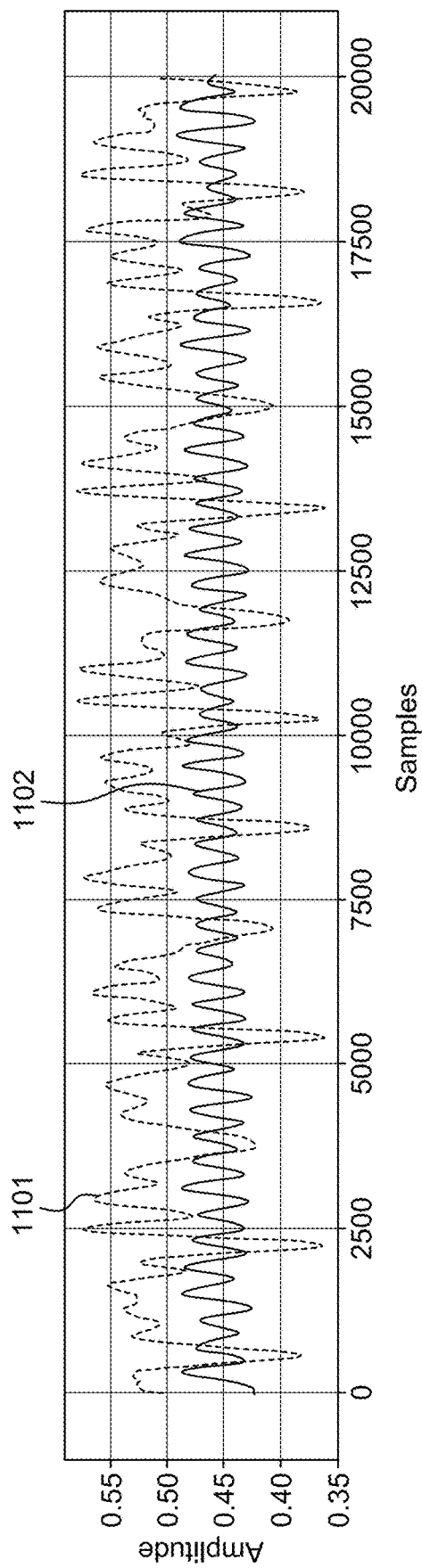
FIG. 11A represents a comparison of the first component in time domain for the 26-turn shorted motor in NL and FL conditions, according to aspects of the present disclosure.

FIG. 10 and FIG. 11 illustrate the signals related to 26-turn shorted motor. For 26-turn fault scenario, the NL 26-turns fault's acoustic signal shows resemblance with the corresponding healthy and 9-turns fault cases such that a similar envelop is followed. This is not true for NL 4-turn fault where a significant distortion is observed in the envelop FIG. 6A (as shown as signal 601) due to the presence of 25 Hz component. FIG. 10A represents two types of signals, where signal 1001 indicates an original data and signal 1002 is first component for a 26-turn shorted motor in NL condition. Further, the FIG. 10B represents two types of signals, where signal 1003 indicates an original data and signal 1004 is first component for a 26-turn shorted motor in full load condition. Comparison of FIG. 10A (as shown signal 1001) with FIG. 10B depicts the acoustic signal (as shown signal 1003) following an envelope for NL as opposed to its FL counterpart. Further, FIG. 11 represents a comparison of the first component in time domain and frequency domain for the 26-turn shorted motor in NL and FL conditions. In FIG. 11A, signal 1101 indicates the first component in FL condition and signal 1102 indicates the first component in NL condition for the 26-turn shorted motor in time domain. Further, in frequency domain, signal 1103 indicates the first component in FL condition, and signal 1104 indicates the first component in NL condition for the 26-turn shorted motor.

Figure 11B:
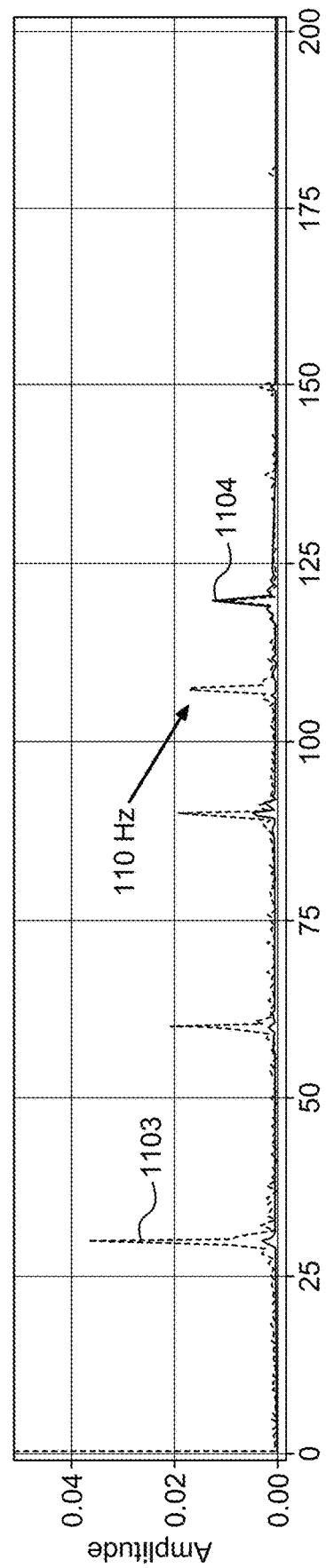
FIG. 11B represents a comparison of the first component in frequency domain for the 26-turn shorted motor in NL and FL conditions, according to aspects of the present disclosure.

The 110 Hz component for FL mode can be observed in FIG. 11B (as shown as signal 1103), which is responsible for introducing the distortions in the first component.

Fifth Experiment: Determining the 40-Turns Fault in a LSPMSM

Figure 12A:
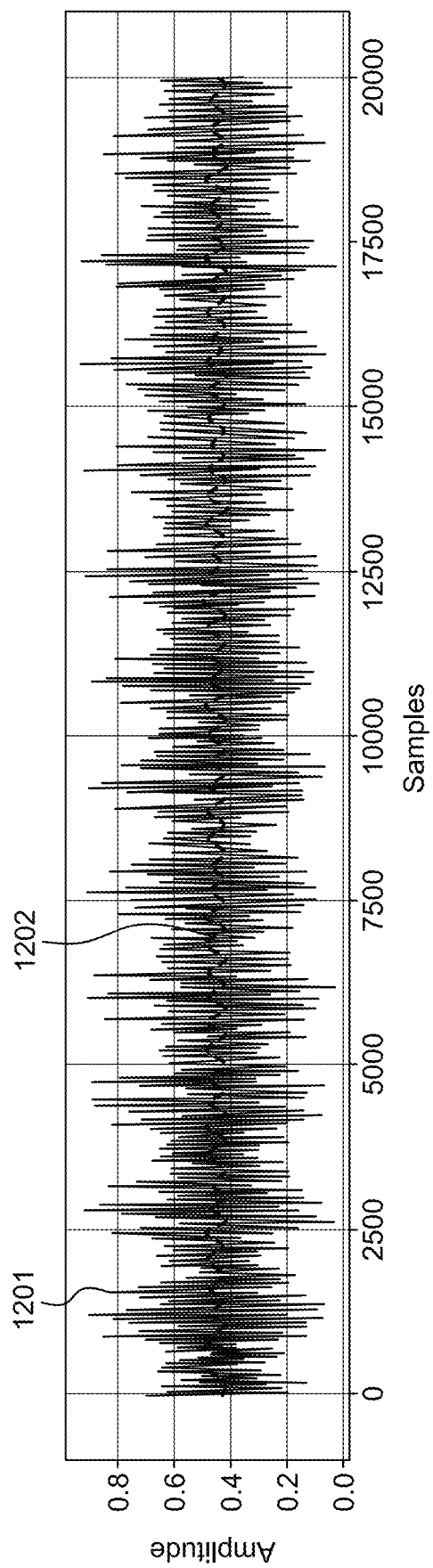
FIG. 12A represents a set of samples of a first component for a 40-turn shorted motor in NL condition, according to aspects of the present disclosure.
Figure 12B:
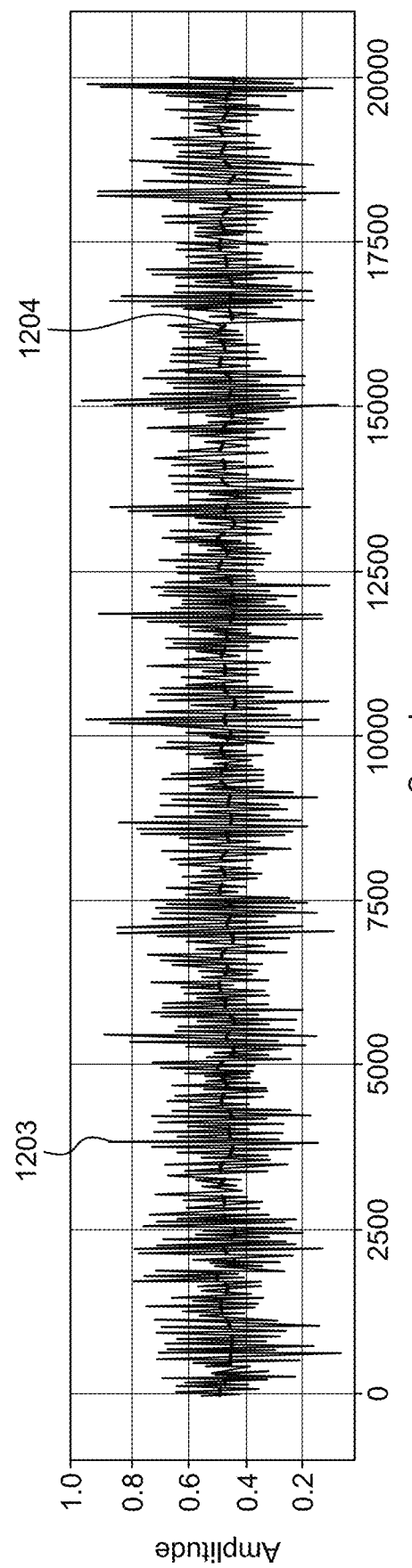
FIG. 12B represents a set of samples of a first component for a 40-turn shorted motor in FL condition, according to aspects of the present disclosure.

FIG. 12 and FIG. 13 illustrate the signals related to 26-turn shorted motor. To demonstrate the effectiveness of the proposed SSA-based algorithm, a more severe 40-turn shorted fault has been examined (as shown in FIG. 12A and FIG. 12B). FIG. 12A represents two types of signals, where signal 1201 indicates an original data and signal 1202 is a first component for a 40-turn shorted motor in NL condition. Further, the FIG. 12B represents two types of signals, where signal 1203 indicates an original data and signal 1204 is a first component for a 40-turn shorted motor in FL condition.

Figure 13A:
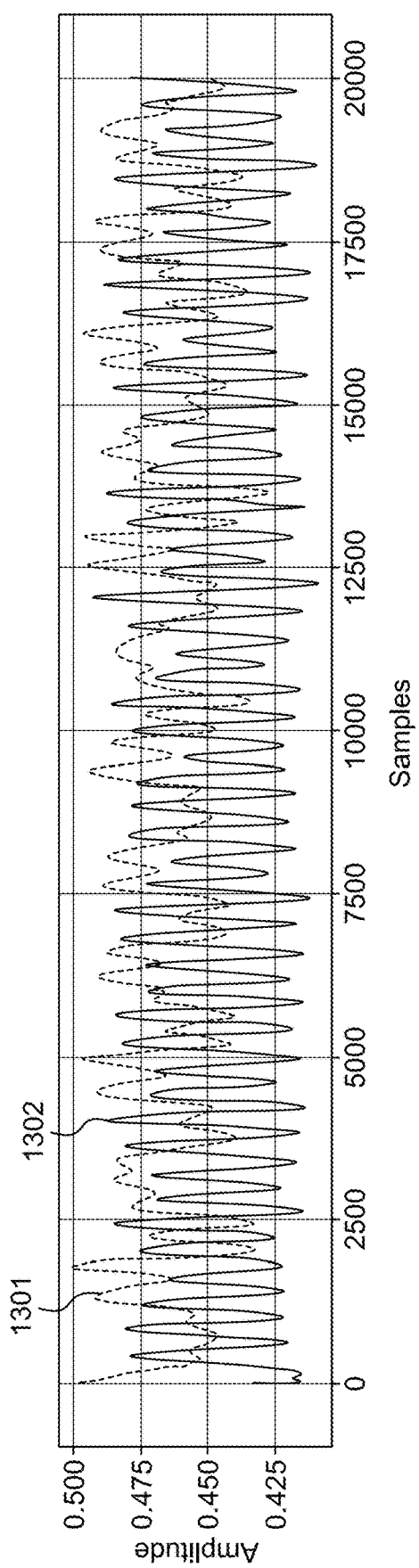
FIG. 13A represents a comparison of the first component in time domain for the 40-turn shorted motor in NL and FL conditions, according to aspects of the present disclosure.
Figure 13B:
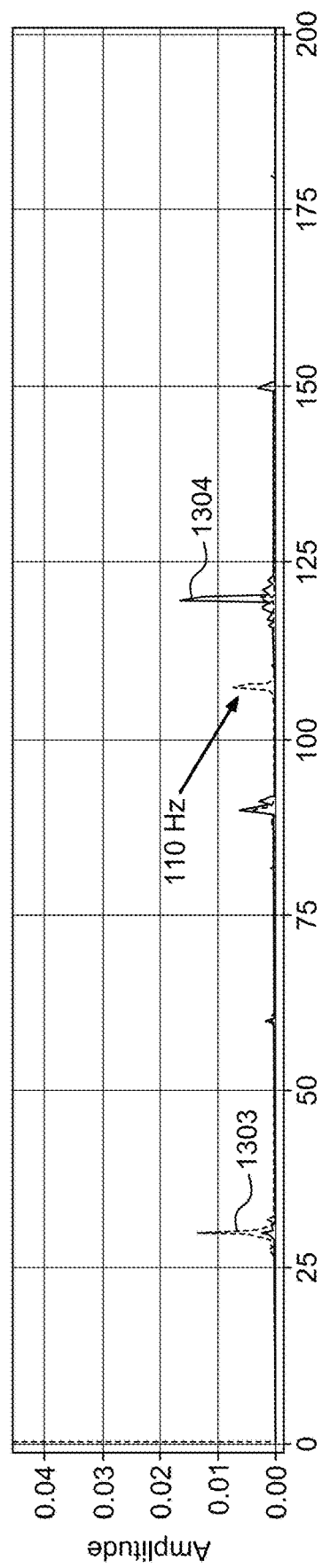
FIG. 13B represents a comparison of the first component in frequency domain for the 40-turn shorted motor in NL and FL conditions, according to aspects of the present disclosure.

FIG. 13 represents a comparison of the first component in time domain and frequency domain for the 40 turn shorted motor in NL and FL conditions. In FIG. 13A, signal 1301 indicates the first component in FL condition and signal 1302 indicates the first component in NL condition for the 40-turn shorted motor in the time domain. Further, in the frequency domain, signal 1303 indicates the first component in FL condition and signal 1304 indicates the first component in NL condition for the 40-turn shorted motor. It was observed that the NL and FL modes/operations can still be differentiated using 110 Hz component for later, where the harmonics of 30 Hz can still be observed for the former as shown in FIG. 13B (as shown by signal 1304). This shows the effectiveness of the SSA 108 to successfully identify the no and full load cases. Unlike the previous cases, the first component for NL (signal 1302) shows higher amplitude, comparable to that for the FL case (signal 1301), while retaining nearly sinusoidal behavior as illustrated in FIG. 13A. Furthermore, the first component for FL case (signal 1303, having singular value=2042) has lesser energy as compared with corresponding 4, 9, and 26 turn fault cases.

Sixth Experiment: Determining Healthy and Faulty Conditions of a LSPMSM

After successfully identifying the load condition of the motor, next step is to differentiate among different inter-turn faults based on their severity. The analysis using the SSA 108 was used with the same window length L=200 and the FFT 110 of the first thirty out of 200 components was visually inspected to find the distinct frequencies for each fault case as well as a healthy mode of operation. Multiple windows were analyzed for each audio file using the same window length of 200 samples. Specifically, they were 0-53000, 45000-52000, 82500-90000, and 0-96000 samples, i.e., complete signal frame of 2 s. As described above, different windows have been examined to ensure that the analysis algorithm does not depend on the window size and its placement over the complete data frame. Consistent results were observed for each window despite the presence of different types of noise within a given acoustic frame. In the present disclosure, the results for only 0-96000 window are shown to maintain brevity. NL scenario is discussed below, followed by the FL case.

For the NL condition, $18^{th}$ component shows distinct frequency modes for healthy as well as each fault case. The approximate frequency modes observed are shown in Table 3 and illustrated through FIG. 14A-F representing FFT of the $18^{th}$ component of NL acoustic signal corresponding to various frequencies.

According to an aspect, various Frequency modes for NL operating mode in the $18^{th}$ component of the SSA 108 are listed in Table 3.

TABLE 3

Frequency modes for NL operating mode in the $18^{th}$ component of SSA.

| Mode - Fault | Approx. Frequency [Hz] |
| --- | --- |
| No load - Healthy | 2750 |
| No load - 4-turn fault | 240 |
| No load - 9-turn fault | 2450 |
| No load - 26-turn fault | 6950 |
| No load - 40-turn fault | 3600 |

Figure 14A:
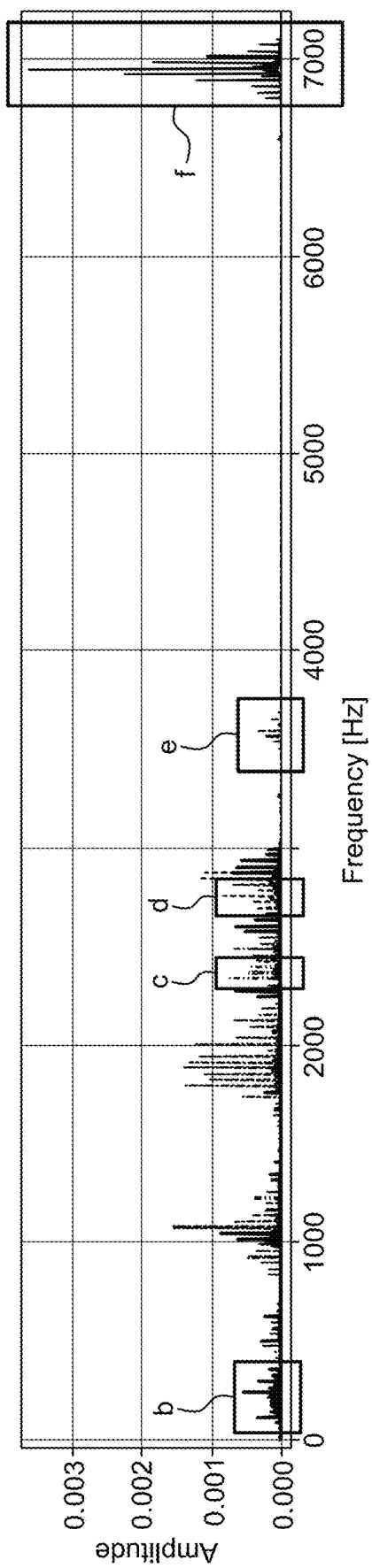
FIG. 14A represents FFT of the $18^{th}$ component of NL acoustic signal corresponding to various frequencies, according to aspects of the present disclosure.
Figure 14B:
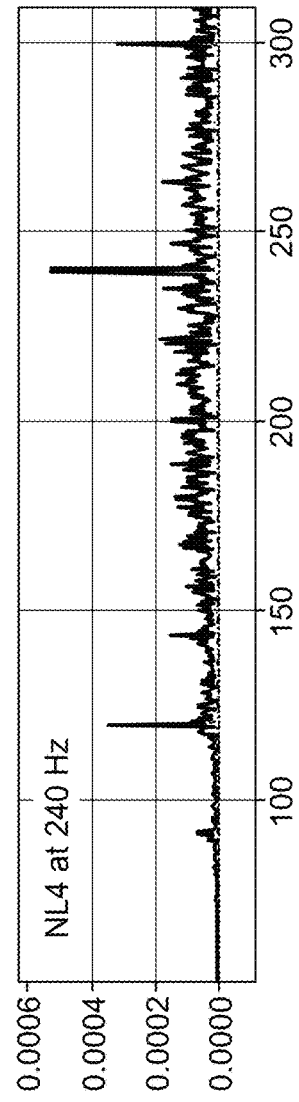
FIG. 14B represents FFT of the $18^{th}$ component of NL acoustic signal corresponding to NL 4-turn fault at 240 Hz, according to aspects of the present disclosure.
Figure 14C:
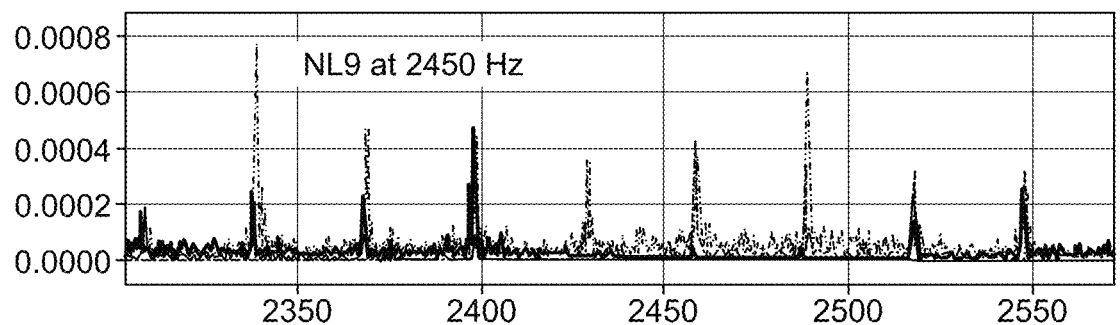
FIG. 14C represents FFT of the $18^{th}$ component of NL acoustic signal corresponding to NL 9-turn fault at 2450 Hz, according to aspects of the present disclosure.

However, it was challenging for 9-turn fault to differentiate between the frequency peaks as shown in FIG. 14B as the peaks of 4-, 9-, and 40-turn faults can be observed around 2400 Hz. On the other hand, the 9-turn fault in NL operation is the only case where this peculiarity is observed and it can be tackled using sophisticated peak-detection algorithms, which are sensitive to minor frequency shifts. An alternative can be the use of other component, which shows a distinct frequency for this fault in conjunction with the $18^{th}$ component. For FL operation, $11^{th}$ component shows the distinct frequency modes for healthy as well as each fault case. The results are shown below in Table 4 and illustrated through FIG. 15A-F. FIG. 15A-F represents FFT of the $11^{th}$ component of FL acoustic signal corresponding to various frequencies.

According to an aspect, various frequency modes for FL operating mode in the $11^{th}$ component of SSA are listed in Table 4.

TABLE 4

Frequency modes for NL operating mode in the $18^{th}$ component of SSA.

| Mode - Fault | Approx. Frequency [Hz] |
| --- | --- |
| Full load - Healthy | 1900 |
| Full load - 4-turn fault | 1400 |
| Full load - 9-turn fault | 500 |
| Full load - 26-turn fault | 2450 |
| Full load - 40-turn fault | 1200 |

Figure 15C:
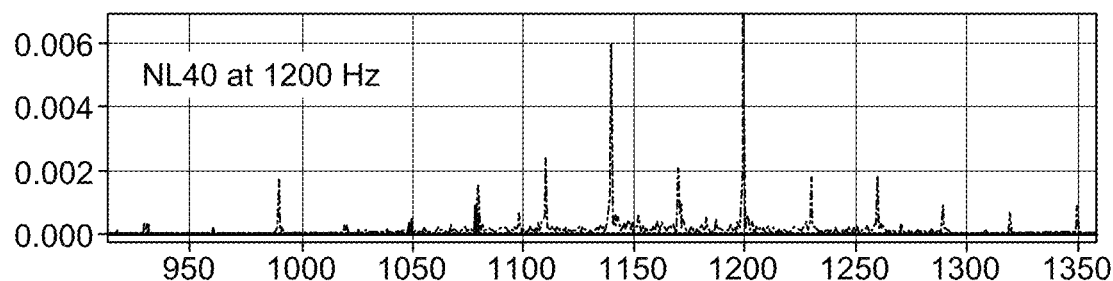
FIG. 15C represents FFT of the $11^{th}$ component of FL acoustic signal corresponding to FL40-turn fault at 1200 Hz, according to aspects of the present disclosure.
Figure 15D:
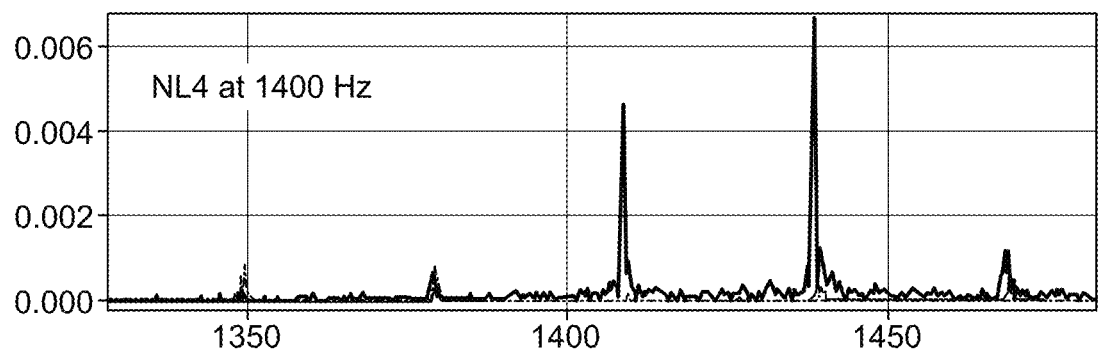
FIG. 15D represents FFT of the $11^{th}$ component of FL acoustic signal corresponding to FL4-turn fault at 1400 Hz, according to aspects of the present disclosure.
Figure 15E:
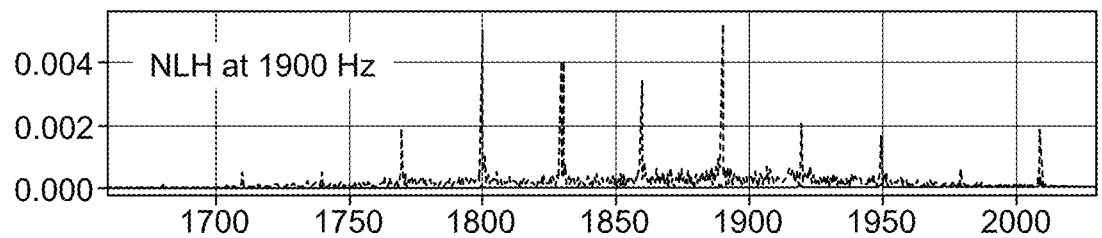
FIG. 15E represents FFT of the $11^{th}$ component of FL acoustic signal corresponding to FL healthy at 1900 Hz, according to aspects of the present disclosure.
Figure 15F:
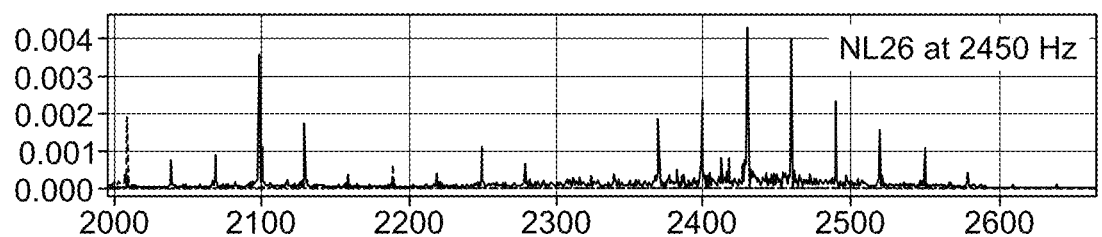
FIG. 15F represents FFT of the $11^{th}$ component of FL acoustic signal corresponding to FL26-turn fault at 2450 Hz, according to aspects of the present disclosure.

FIG. 15A represents FFT of the $11^{th}$ component of FL acoustic signal corresponding to various frequencies. FIG. 15B represents FFT of the $11^{th}$ component of FL acoustic signal corresponding to FL 9-turn fault at 500 Hz. FIG. 15C represents FFT of the $11^{th}$ component of FL acoustic signal corresponding to FL40-turn fault at 1200 Hz. FIG. 15D represents FFT of the $11^{th}$ component of FL acoustic signal corresponding to FL4-turn fault at 1400 Hz. FIG. 15E represents FFT of the $11^{th}$ component of FL acoustic signal corresponding to FL healthy at 1900 Hz. FIG. 15F represents FFT of the $11^{th}$ component of FL acoustic signal corresponding to FL26-turn fault at 2450 Hz.

Figure 14D:
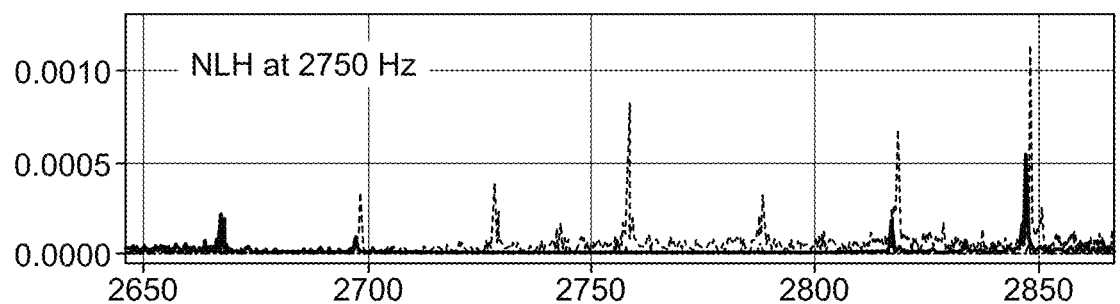
FIG. 14D represents FFT of the $18^{th}$ component of NL acoustic signal corresponding to NL healthy at 2750 Hz, according to aspects of the present disclosure.
Figure 14E:
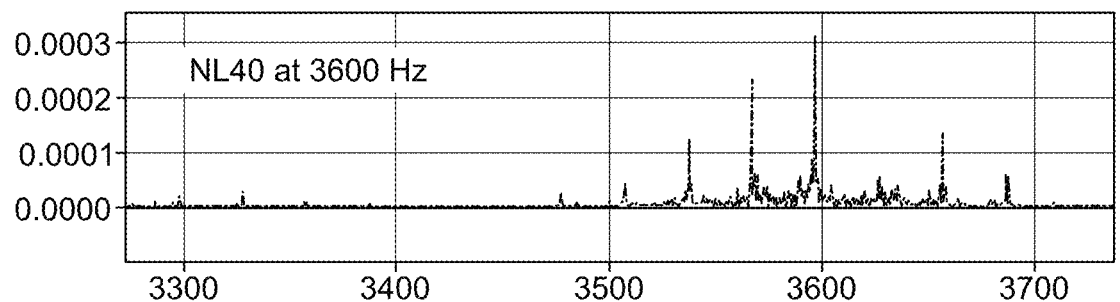
FIG. 14E represents FFT of the $18^{th}$ component of NL acoustic signal corresponding to NL 40-turn fault at 3600 Hz., according to aspects of the present disclosure.
Figure 14F:
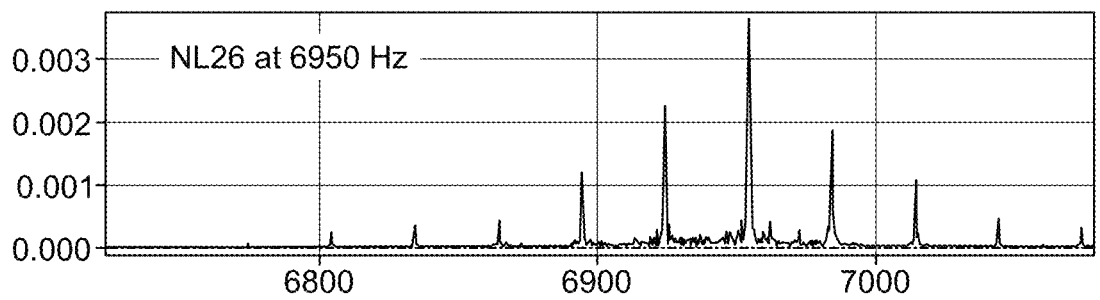
FIG. 14F represents FFT of the $18^{th}$ component of NL acoustic signal corresponding to NL 26-turn fault at 6950 Hz, according to aspects of the present disclosure.

In FL case, the frequencies for healthy and fault conditions are distinct and well separated. This makes the identification of the fault and healthy modes much easier. This was not the case for NL where it was challenging to identify 9-turns fault case (FIG. 14C) and the frequency band for healthy case was narrow (FIG. 14D representing FFT of the $18^{th}$ component of NL acoustic signal corresponding to NL healthy motor at 2750 Hz). Note that the frequencies identified for each fault case in NL and FL operation are different. FIG. 14E represents FFT of the $18^{th}$ component of NL acoustic signal corresponding to NL 40-turn fault at 3600 Hz, and FIG. 14F represents FFT of the $18^{th}$ component of NL acoustic signal corresponding to NL 26-turn fault at 6950 Hz. From an implementation point of view, the acoustic signal will be analyzed to reveal the load condition first, and then the respective fault and healthy mode frequencies for NL and FL (given in Tables 3 and 4) will be identified.

The first embodiment is illustrated with respect to FIGS. 1-2. The first embodiment describes a method for diagnosing stator inter-turn faults in the LSPMSM 102. The method includes collecting acoustic signals 114 that are generated from the LSPMSM 102 by the communication device 104, analyzing via the SSA 108 the collected acoustic signals 116 for fault detection of the stator inter-turn faults, and determining a fault diagnosis 120 for the fault detection by executing the FFT 110.

The acoustic signals 114 are collected using the communication device 104 under different loading levels, and wherein a different number of turns are shorted to emulate different fault levels. The SSA analysis results in decompression of the acoustic signals into periodic components and noise. The FFT of each of the periodic components is executed to determine a unique frequency represented for each fault case. Each fault case is based on a number of shorted turns and a loading level. The fault detection determines an occurrence of inter-turn fault under different loading levels with the fault diagnosis distinguishing fault severity. The distinguishing fault severity is based on an available acoustic sensor of the communication device 104. The fault detection differentiates between load and no-load modes of operation. The communication device 104 is mounted on the LSPMSM 102.

The second embodiment is illustrated with respect to FIGS. 1-2. The second embodiment describes the system 100 for diagnosing stator inter-turn faults in Line Start Permanent Magnet Synchronous Motor (LSPMSM 102). The system 100 includes the communication device 104 for collecting acoustic signals that are generated from the LSPMSM 102 and a fault diagnosing unit 106 comprising the at least one processor 112 capable of analyzing the collected acoustic signals 116 by the SSA 108 for fault detection of the stator inter-turn faults, and determining the fault diagnosis 120 for the fault detection by executing the FFT 110, wherein the SSA 108 detects the stator inter-turn faults under different loading levels and the FFT 110 provides a diagnoses of fault severity based on the detected stator inter-turn faults. The acoustic signals 114 are collected using the communication device 104 under different loading levels, and wherein a different number of turns are shorted to emulate different fault levels. The SSA 108 results in decompression of the acoustic signals into periodic components and noise, and wherein the FFT 110 of each of the periodic components is executed to determine a unique frequency represented for each fault case. Each fault case is based on a number of shorted turns and a loading level. The detection determines an occurrence of inter-turn fault under different loading levels with fault diagnosis distinguishing fault severity. The fault analysis differentiates between load and no-load modes of operation.

The third embodiment is illustrated with respect to FIGS. 1-2. The third embodiment describes a non-transitory computer readable medium having instructions stored therein that, when executed by one or more processors, cause the one or more processors to perform a method to diagnose stator inter-turn faults in the LSPMSM 102. The method includes collecting acoustic signals that are generated from LSPMSM 102, analyzing via the SSA 108 the collected acoustic signals 116 to obtain a fault analysis 118 of the stator inter-turn faults, and determining a fault diagnosis 120 for fault analysis 118 by executing the FFT 110.

The acoustic signals 114 are collected by the communication device 104, which is mounted on the LSPMSM 102. The SSA 108 is operable to differentiate between fault severities under no-load and full-load applications. The SSA analysis results in decompression of the acoustic signals into periodic components and noise. The FFT 110 of each of the periodic components is executed to determine a unique frequency represented for each fault case.

Next, further details of the hardware description of the computing environment of FIG. 1 according to exemplary embodiments is described with reference to FIG. 16.

Figure 16:
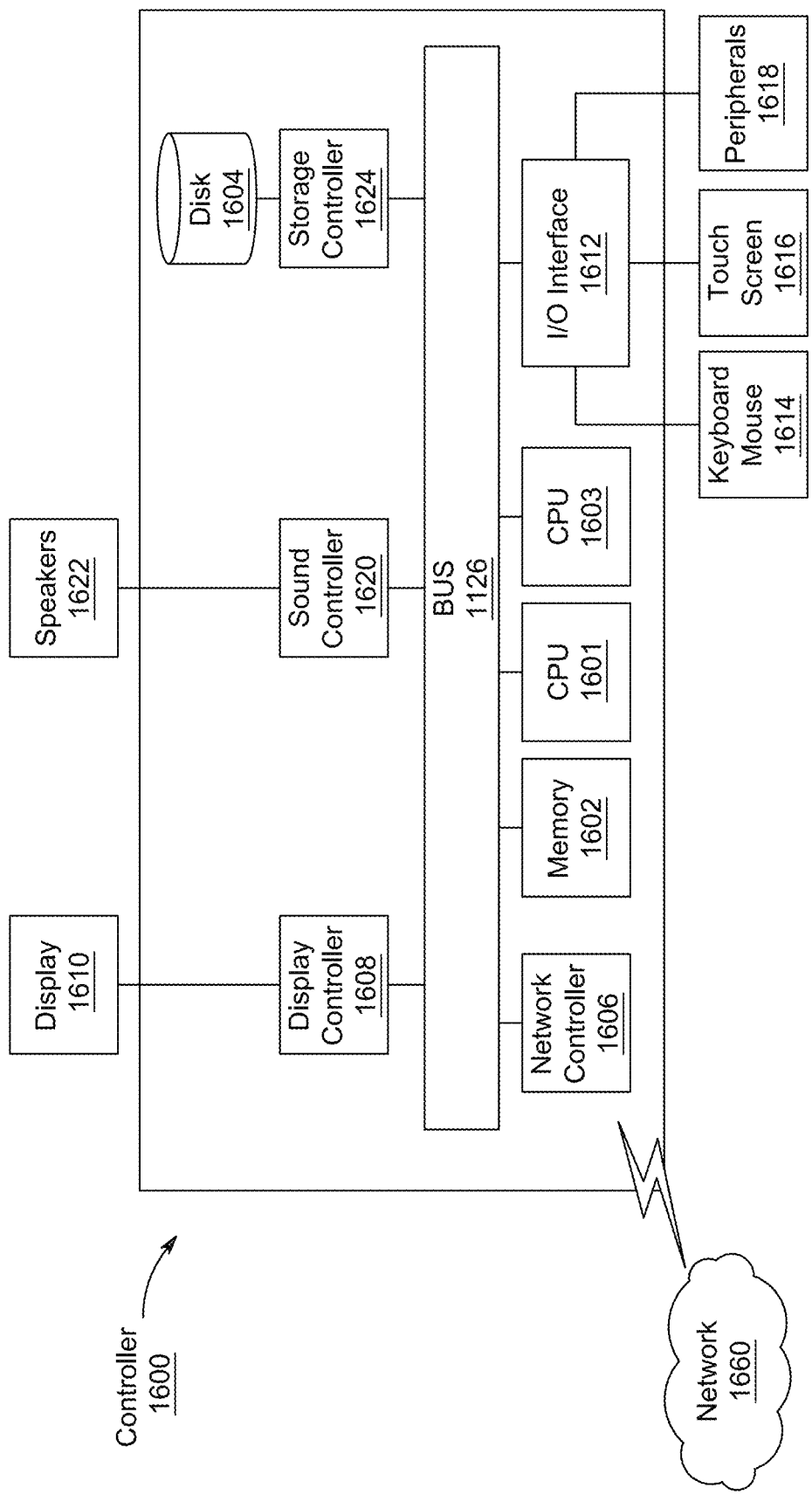
FIG. 16 is an illustration of a non-limiting example of details of computing hardware used in the computing system, according to aspects of the present disclosure.

In FIG. 16, a controller 1600 is described is representative of the system 100 of FIG. 1 in which the controller is a computing device which includes a CPU 1601 which performs the processes described above/below.

FIG. 16 is an illustration of a non-limiting example of details of computing hardware used in the computing system, according to exemplary aspects of the present disclosure. In FIG. 16, a controller 1600 is described which is a computing device (that includes, at least one processor) and includes a CPU 1601 which performs the processes described above/below. The process data and instructions may be stored in memory 1602. These processes and instructions may also be stored on a storage medium disk 1604 such as a hard drive (HDD) or portable storage medium or may be stored remotely.

Further, the claims are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device communicates, such as a server or computer.

Further, the claims may be provided as a utility application, background daemon, or component of an operating system, or combination thereof, executing in conjunction with CPU 1601, 1603 and an operating system such as Microsoft Windows 7, UNIX, Solaris, LINUX, Apple MAC-OS and other systems known to those skilled in the art.

The hardware elements in order to achieve the computing device may be realized by various circuitry elements, known to those skilled in the art. For example, CPU 1601 or CPU 1603 may be a Xenon or Core processor from Intel of America or an Opteron processor from AMD of America, or may be other processor types that would be recognized by one of ordinary skill in the art. Alternatively, the CPU 1601, 1603 may be implemented on an FPGA, ASIC, PLD or using discrete logic circuits, as one of ordinary skill in the art would recognize. Further, CPU 1601, 1603 may be implemented as multiple processors cooperatively working in parallel to perform the instructions of the inventive processes described above.

The computing device in FIG. 16 also includes a network controller 1606, such as an Intel Ethernet PRO network interface card from Intel Corporation of America, for interfacing with network 1660. As can be appreciated, the network 1660 can be a public network, such as the Internet, or a private network such as an LAN or WAN network, or any combination thereof and can also include PSTN or ISDN sub-networks. The network 1660 can also be wired, such as an Ethernet network, or can be wireless such as a cellular network including EDGE, 3G and 4G wireless cellular systems. The wireless network can also be WiFi, Bluetooth, or any other wireless form of communication that is known.

The computing device further includes a display controller 1608, such as a NVIDIA GeForce GTX or Quadro graphics adaptor from NVIDIA Corporation of America for interfacing with display 1610, such as a Hewlett Packard HPL2445w LCD monitor. A general purpose I/O interface 1612 interfaces with a keyboard and/or mouse 1614 as well as a touch screen panel 1616 on or separate from display 1610. General purpose I/O interface also connects to a variety of peripherals 1618 including printers and scanners, such as an OfficeJet or DeskJet from Hewlett Packard.

A sound controller 1620 is also provided in the computing device such as Sound Blaster X-Fi Titanium from Creative, to interface with speakers/microphone 1622 (microphone not shown) thereby providing sounds and/or music.

The general-purpose storage controller 1624 connects the storage medium disk 1604 with communication bus 1626, which may be an ISA, EISA, VESA, PCI, or similar, for interconnecting all of the components of the computing device. A description of the general features and functionality of the display 1610, keyboard and/or mouse 1614, as well as the display controller 1608, storage controller 1624, network controller 1606, sound controller 1620, and general purpose I/O interface 1612 is omitted herein for brevity as these features are known. The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset, as shown on FIG. 17.

Figure 17:
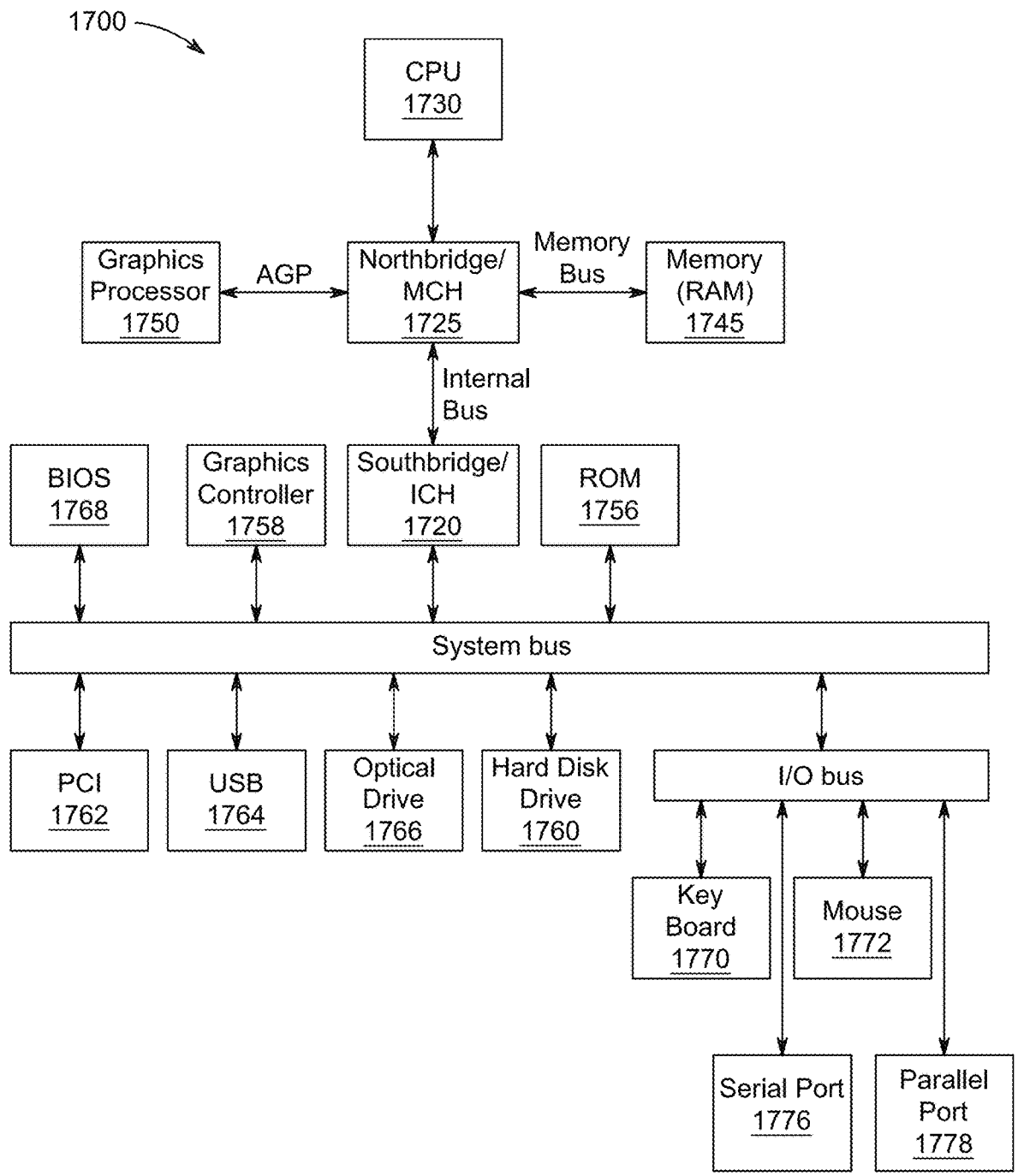
FIG. 17 is an exemplary schematic diagram of a data processing system used within the computing system, according to aspects of the present disclosure.

FIG. 17 shows a schematic diagram of a data processing system 1700 used within the computing system, according to exemplary aspects of the present disclosure. The data processing system 1700 is an example of a computer in which code or instructions implementing the processes of the illustrative aspects of the present disclosure may be located.

In FIG. 17, data processing system 1780 employs a hub architecture including a north bridge and memory controller hub (NB/MCH) 1725 and a south bridge and input/output (I/O) controller hub (SB/ICH) 1720. The central processing unit (CPU) 1730 is connected to NB/MCH 1725. The NB/MCH 1725 also connects to the memory 1745 via a memory bus, and connects to the graphics processor 1750 via an accelerated graphics port (AGP). The NB/MCH 1725 also connects to the SB/ICH 1720 via an internal bus (e.g., a unified media interface or a direct media interface). The CPU Processing unit 1730 may contain one or more processors and even may be implemented using one or more heterogeneous processor systems.

Figure 18:
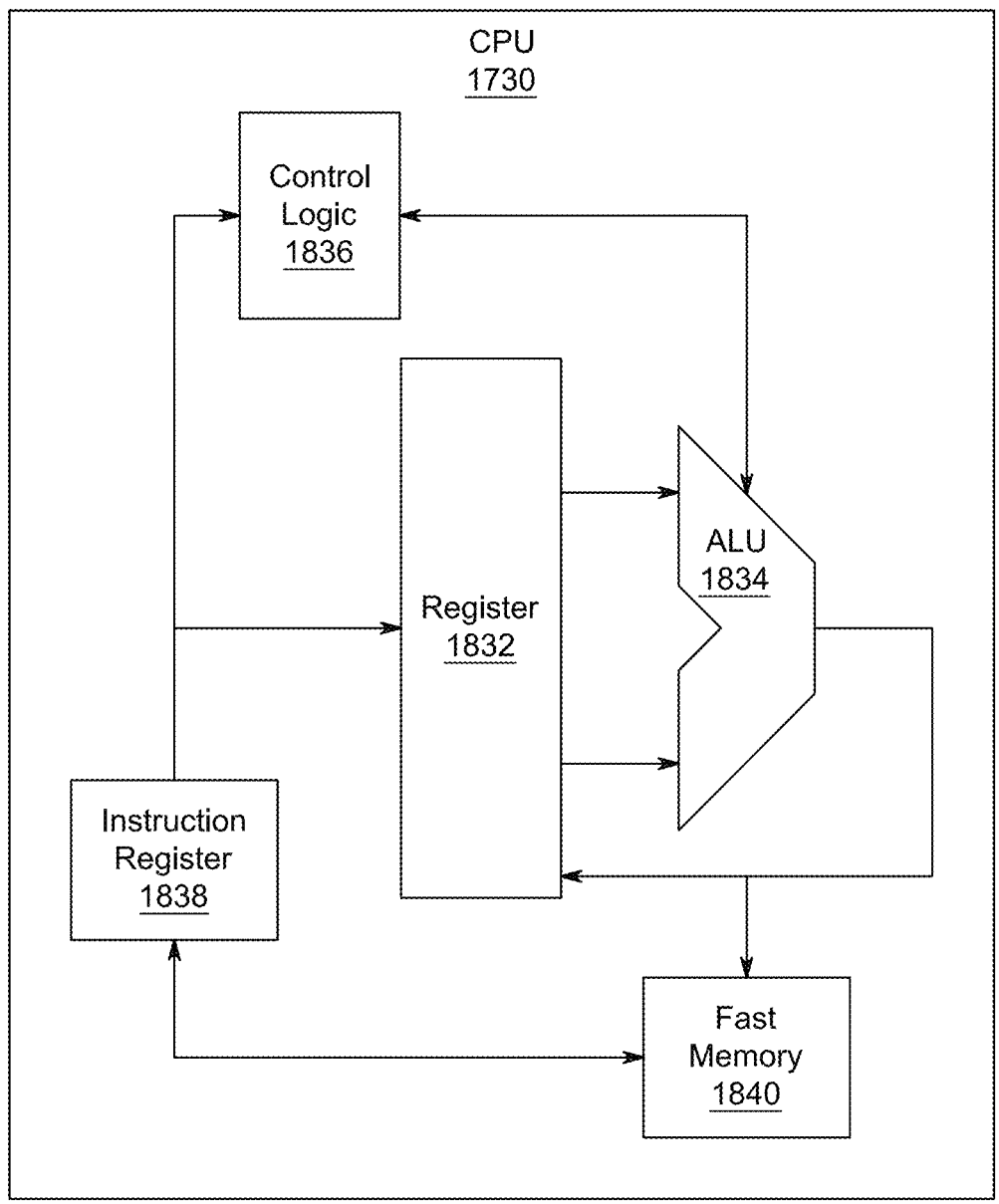
FIG. 18 is an exemplary schematic diagram of a processor used with the computing system, according to aspects of the present disclosure.

For example, FIG. 18 shows one aspects of the present disclosure of CPU 1730. In one aspects of the present disclosure, the instruction register 1838 retrieves instructions from the fast memory 1840. At least part of these instructions is fetched from the instruction register 1838 by the control logic 1836 and interpreted according to the instruction set architecture of the CPU 1730. Part of the instructions can also be directed to the register 1832. In one aspects of the present disclosure the instructions are decoded according to a hardwired method, and in another aspect of the present disclosure the instructions are decoded according to a microprogram that translates instructions into sets of CPU configuration signals that are applied sequentially over multiple clock pulses. After fetching and decoding the instructions, the instructions are executed using the arithmetic logic unit (ALU) 1834 that loads values from the register 1832 and performs logical and mathematical operations on the loaded values according to the instructions. The results from these operations can be feedback into the register and/or stored in the fast memory 1840. According to certain aspects of the present disclosures, the instruction set architecture of the CPU 1730 can use a reduced instruction set architecture, a complex instruction set architecture, a vector processor architecture, a very large instruction word architecture. Furthermore, the CPU 1730 can be based on the Von Neuman model or the Harvard model. The CPU 1730 can be a digital signal processor, an FPGA, an ASIC, a PLA, a PLD, or a CPLD.

Further, the CPU 1730 can be an x86 processor by Intel or by AMD; an ARM processor, a Power architecture processor by, e.g., IBM; a SPARC architecture processor by Sun Microsystems or by Oracle; or other known CPU architecture.

Referring again to FIG. 17, the data processing system 1780 can include that the SB/ICH 1720 is coupled through a system bus to an I/O Bus, a read only memory (ROM) 1756, universal serial bus (USB) port 1764, a flash binary input/output system (BIOS) 1768, and a graphics controller 1758. PCI/PCIe devices can also be coupled to SB/ICH 1720 through a PCI bus 1762. The PCI devices may include, for example, Ethernet adapters, add-in cards, and PC cards for notebook computers. The Hard disk drive 1760 and CD-ROM 1756 can use, for example, an integrated drive electronics (IDE) or serial advanced technology attachment (SATA) interface. In one aspects of the present disclosure the I/O bus can include a super I/O (SIO) device.

Further, the hard disk drive (HDD) 1760 and optical drive 1766 can also be coupled to the SB/ICH 1720 through a system bus. In one aspects of the present disclosure, a keyboard 1770, a mouse 1772, a parallel port 1778, and a serial port 1776 can be connected to the system bus through the I/O bus. Other peripherals and devices that can be connected to the SB/ICH 1720 using a mass storage controller such as SATA or PATA, an Ethernet port, an ISA bus, an LPC bridge, SMBus, a DMA controller, and an Audio Codec.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry, or based on the requirements of the intended back-up load to be powered.

Figure 19:
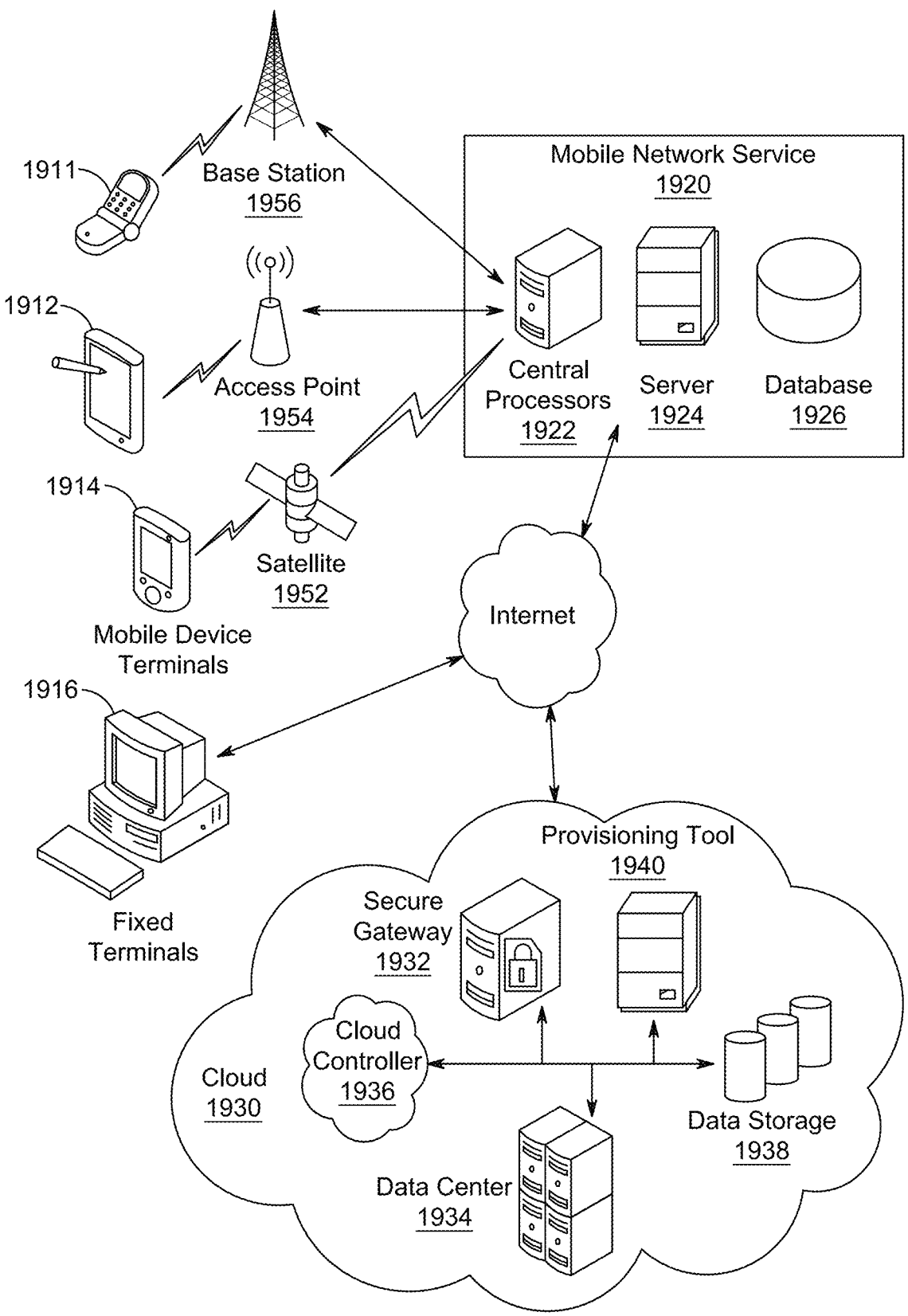
FIG. 19 is an illustration of a non-limiting example of distributed components that may share processing with the controller, according to aspects of the present disclosure.

The functions and features described herein may also be executed by various distributed components of a system. For example, one or more processors may execute these system functions, wherein the processors are distributed across multiple components communicating in a network. The distributed components may include one or more client and server machines, which may share processing, as shown by FIG. 19, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process.

More specifically, FIG. 19 illustrates client devices including smart phone 1911, tablet 1912, mobile device terminal 1914 and fixed terminals 1916. These client devices may be commutatively coupled with a mobile network service 1920 via base station 1956, access point 1954, satellite 1952 or via an internet connection. Mobile network service 1920 may comprise central processors 1922, server 1924 and database 1926. Fixed terminals 1916 and mobile network service 1920 may be commutatively coupled via an internet connection to functions in cloud 1930 that may comprise security gateway 1932, data center 1934, cloud controller 1936, data storage 1938 and provisioning tool 1940.

Figure 20:
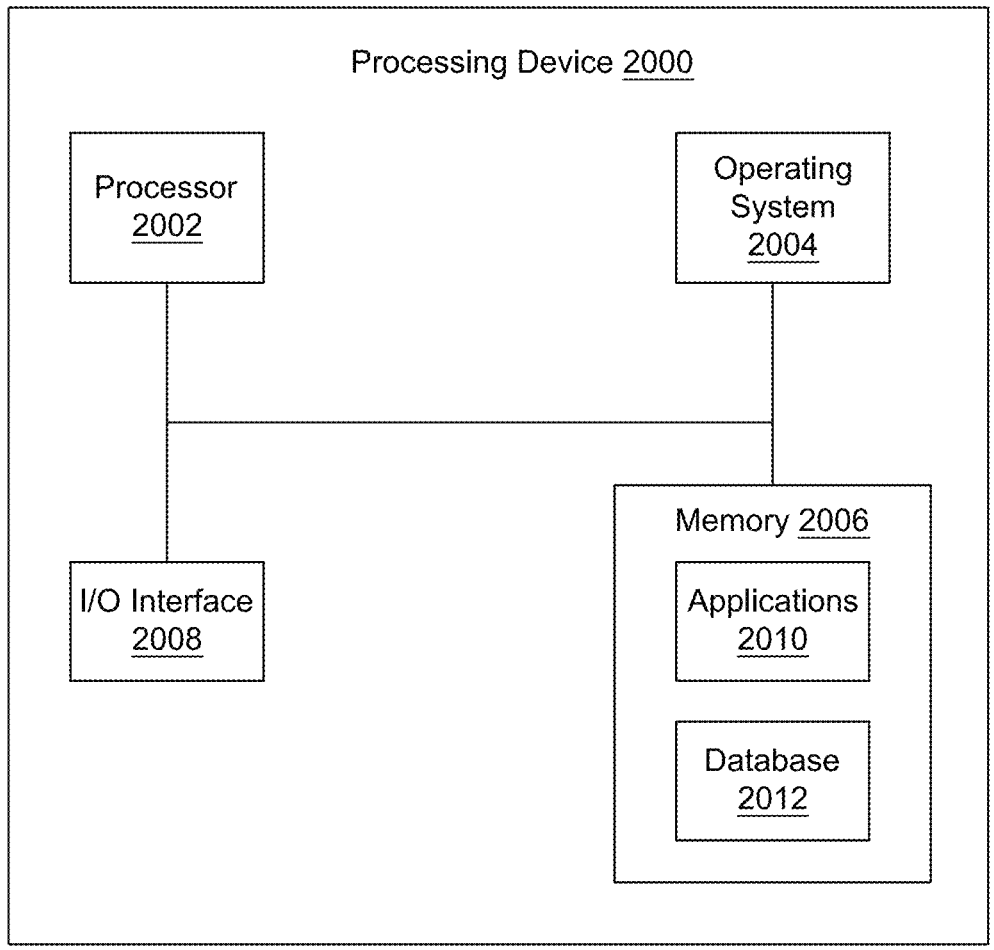
FIG. 20 is a diagram of a processing device that can support fault diagnosis of stator inter-turn faults in a line start permanent magnet synchronous motor, according to some embodiments of the present disclosure.

FIG. 20 is a diagram of a processing device 2000 that can support fault diagnosis of stator inter-turn faults in a line start permanent magnet synchronous motor, according to some embodiments of the present disclosure. FIG. 20 illustrates one block for each of processor 2002, operating system 2004, memory 2006, and I/O interface 2008.

Memory 2006 may comprise application 2010 and database 2012. These blocks may represent one or more processors or processing circuitries, operating systems, memories, I/O interfaces, applications, and/or software modules. In other implementations, processing device 2000 may not have all of the components shown and/or may have other elements including other types of elements instead of, or in addition to, those shown herein.

In general, a computer that performs the processes described herein can include one or more processors and a memory (e.g., a non-transitory computer readable medium). The process data and instructions may be stored in the memory. These processes and instructions may also be stored on a storage medium such as a hard drive (HDD) or portable storage medium or may be stored remotely. Note that each of the functions of the described embodiments may be implemented by one or more processors or processing circuits. A processing circuit can include a programmed processor, as a processor includes circuitry. A processing circuit/circuitry may also include devices such as an application specific integrated circuit (ASIC) and conventional circuit components arranged to perform the recited functions. The processing circuitry can be referred to interchangeably as circuitry throughout the disclosure. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device.

Additionally, some aspects of the present disclosures may be performed on modules or hardware not identical to those described. Accordingly, other aspects of the present disclosures are within the scope that may be claimed.

The above-described hardware description is a non-limiting example of corresponding structure for performing the functionality described herein.

Obviously, numerous modifications and variations of the present disclosure are possible in light of the above teachings. It is therefore to be understood that within the scope of the appended claims, the disclosure may be practiced otherwise than as specifically described herein.

The invention claimed is:

1. A method for diagnosing stator inter-turn faults in a Line Start Permanent Magnet Synchronous Motor (LSPMSM), the method comprising: collecting, by a communication device, acoustic signals that are generated from a LSPMSM; transmitting, by the communication device, the collected acoustic signals to a fault diagnosing unit that comprises one or more processors; utilizing the one or more processors for: analyzing via singular spectrum analysis (SSA) the collected acoustic signals for fault detection of the stator inter-turn faults, the SSA analysis including structuring the collected acoustic signals in a matrix form, where a number of rows in the matrix is equal to a desired number of components in which the collected acoustic signals are configured to be decomposed, applying a singular value decomposition to the matrix for a decomposition, obtaining component matrices, grouping the component matrices to a group related periodicities or patterns in the collected acoustic signals, and reconstructing the matrix from time-series of the component matrices; and determining a fault diagnosis for the fault detection by executing a Fast Fourier Transform (FFT), wherein the LSPMSM comprises a stationary stator, comprising stator windings, and a rotating rotor, comprising permanent magnets, and wherein the stator inter-turn faults occur when the stator windings are shorted, and the SSA analysis is configured to differentiate between load and no-load modes of operation and to detect the stator inter-turn faults under different loading levels.

2. The method of claim 1, wherein the collected acoustic signals comprise information based on a loading level of the LSPMSM.

3. The method of claim 1, wherein the collected acoustic signals comprise information based on a number of stator inter-turn faults in the stator windings.

4. The method of claim 1, wherein the fault detection based on the SSA analysis determines an occurrence of stator inter-turn faults under different loading levels.

5. The method of claim 1, wherein the LSPMSM is further equipped with a squirrel cage to rotate the rotor from stationary position, with the magnets assisting the motor to maintain a synchronous speed.

6. The method of claim 1, wherein the communication device comprises an acoustic sensor to collect the acoustic signals.

7. The method of claim 1, wherein the SSA analysis is configured to decompress the collected acoustic signals into periodic components and noise.

8. The method of claim 7, further comprising:
    executing the FFT of each of the periodic components to determine a unique frequency represented for each fault case.

9. The method of claim 7, wherein each fault case is based on a number of shorted turns in the stator winding and a loading level of the LSPMSM.

10. A system for diagnosing stator inter-turn faults in a Line Start Permanent Magnet Synchronous Motor (LSPMSM), the system comprising: a communication device for collecting acoustic signals that are generated from a LSPMSM; and a fault diagnosing unit comprising at least one processor configured to 1) receive and analyze the collected acoustic signals by a singular spectrum analysis (SSA) for fault detection of the stator inter-turn faults, the SSA analysis configured to structure the collected acoustic signals in a matrix form, where a number of rows in the matrix is equal to a desired number of components in which the collected acoustic signals are configured to be decomposed, apply a singular value decomposition to the matrix for a decomposition, obtain component matrices, group the component matrices to a group related periodicities or patterns in the collected acoustic signals, and reconstruct the matrix from time-series of the component matrices, and 2) determine a fault diagnosis for the fault detection by executing a Fast Fourier Transform (FFT), wherein the LSPMSM comprises a stationary stator, comprising stator windings, and a rotating rotor, comprising permanent magnets, and wherein the stator inter-turn faults occur when the stator windings are shorted, and the SSA analysis is configured to differentiate between load and no-load modes of operation and to detect the stator inter-turn faults under different loading levels.

11. The system of claim 10, wherein the collected acoustic signals comprise information based on loading levels of the LSPMSM, and number of turns shorted in the stator winding.

12. The system of claim 10, wherein the fault detection based on the SSA analysis determines an occurrence of stator inter-turn faults under different loading levels.

13. The system of claim 10, wherein the communication device comprises an acoustic sensor to collect the acoustic signals.

14. The system of claim 10, wherein the SSA analysis is configured to decompress the collected acoustic signals into periodic components and noise, and further comprises executing the FFT of each of the periodic components to determine a unique frequency represented for each fault case.

15. The system of claim 14, wherein each fault case is based on a number of shorted turns in the stator windings and loading levels of LSPMSM.

16. A non-transitory computer readable medium having instructions stored therein that, when executed by one or more processors, cause the one or more processors to perform a method to diagnose stator inter-turn faults in a Line Start Permanent Magnet Synchronous Motor (LSPMSM), the method comprising: analyzing via singular spectrum analysis (SSA) acoustic signals generated by the LSPMSM and collected by a communication device to obtain a fault analysis of the stator inter-turn faults, the SSA analysis including structuring the collected acoustic signals in a matrix form, where a number of rows in the matrix is equal to a desired number of components in which the collected acoustic signals are configured to be decomposed, applying a singular value decomposition to the matrix for a decomposition, obtaining component matrices, grouping the component matrices to a group related periodicities or patterns in the collected acoustic signals, and reconstructing the matrix from time-series of the component matrices, wherein the communication device transmits the collected acoustic signals to a fault diagnosing unit that comprises the one or more processors; and determining a fault diagnosis for the fault analysis by executing a Fast Fourier Transform (FFT), wherein the LSPMSM comprises a stationary stator, comprising stator windings, and a rotating rotor, comprising permanent magnets, and wherein the stator inter-turn faults occur when the stator windings are shorted, and the SSA analysis is configured to differentiate between load and no-load modes of operation and to detect the stator inter-turn faults under different loading levels.

17. The non-transitory computer readable medium of claim 16, wherein the acoustic signals are collected by the communication device comprising an acoustic sensor.

18. The non-transitory computer readable medium of claim 16, wherein the fault detection based on the SSA analysis determines an occurrence of stator inter-turn faults under different loading levels.

19. The non-transitory computer readable medium of claim 16, wherein the SSA analysis is configured to decompress the collected acoustic signals into periodic components and noise.

20. The non-transitory computer readable medium of claim 19, further comprising: executing the FFT of each of the periodic components to determine a unique frequency represented for each fault case.

* * * * *